US009609783B2

United States Patent
Nishiyama

(10) Patent No.: US 9,609,783 B2
(45) Date of Patent: Mar. 28, 2017

(54) RACK MOUNT DEVICE

(71) Applicant: FUJITSU LIMITED, Kawasaki-shi, Kanagawa (JP)

(72) Inventor: Takeshi Nishiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 32 days.

(21) Appl. No.: 14/857,923

(22) Filed: Sep. 18, 2015

(65) Prior Publication Data
US 2016/0157377 A1    Jun. 2, 2016

(30) Foreign Application Priority Data

Nov. 27, 2014 (JP) ................................ 2014-239632

(51) Int. Cl.
*H05K 7/14* (2006.01)
*G06F 1/18* (2006.01)

(52) U.S. Cl.
CPC .......... *H05K 7/1489* (2013.01); *G06F 1/183* (2013.01); *H05K 7/1411* (2013.01)

(58) Field of Classification Search
CPC ....... H05K 7/1411; G06F 1/181; G06F 1/183; G06F 1/184; G06F 1/187; G06F 1/188
See application file for complete search history.

(56) References Cited

U.S. PATENT DOCUMENTS

| 5,010,426 | A | * | 4/1991 | Krenz | G11B 25/043 360/137 |
| 5,641,296 | A | * | 6/1997 | Larabell | G06F 1/184 439/157 |
| 7,210,751 | B2 | * | 5/2007 | Nakayama | H01M 2/1077 312/223.1 |
| 7,307,835 | B1 | * | 12/2007 | Barina | G06F 1/187 248/917 |
| 7,535,717 | B2 | * | 5/2009 | Lai | G06F 1/181 361/727 |
| 2002/0104396 | A1 | * | 8/2002 | Megason | F16H 51/00 74/109 |
| 2008/0101040 | A1 | * | 5/2008 | Tang | G06F 1/188 361/727 |

FOREIGN PATENT DOCUMENTS

JP    2001-244663 A    9/2001
JP    2012-094708 A    5/2012

* cited by examiner

*Primary Examiner* — Adrian S Wilson
(74) *Attorney, Agent, or Firm* — Squire Patton Boggs (US) LLP

(57) ABSTRACT

A rack mount device includes: a support rail which is provided in a rack and which extends in a front-rear direction of the rack; an electronic device which is housed in the rack along the support rail and which is supported by the support rail; an upper support portion which is provided in the rack and which is arranged at a position higher than the support rail; and a holding member which extends obliquely downward from the upper support portion to a side to which the electronic device is drawn out and which holds the electronic device outside of the rack in a state in which the electronic device has been drawn out from the rack along the support rail.

19 Claims, 23 Drawing Sheets

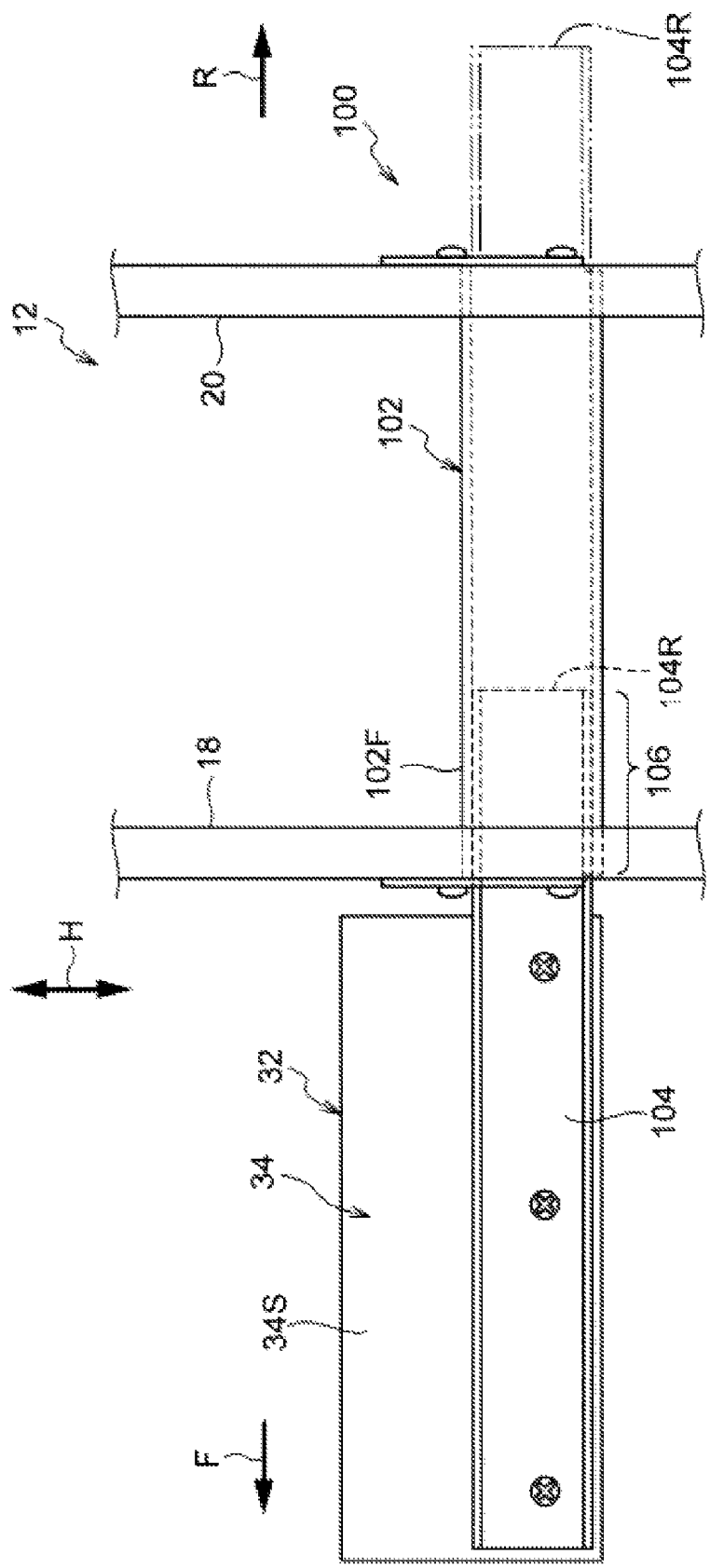

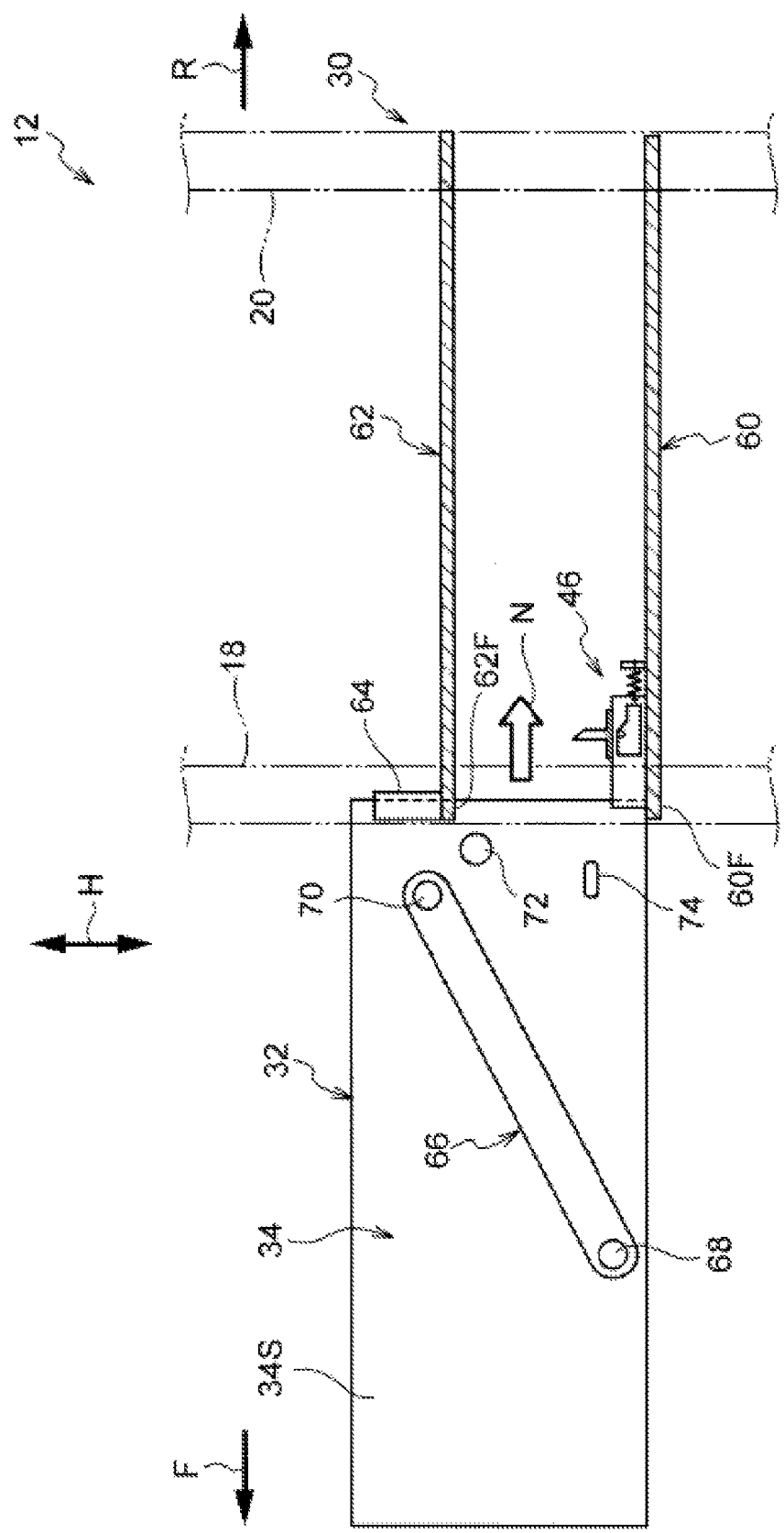

RACK MOUNT DEVICE

CROSS-REFERENCE TO RELATED APPLICATION

This application is based upon and claims the benefit of priority of the prior Japanese Patent Application No. 2014-239632, filed on Nov. 27, 2014, the entire contents of which are incorporated herein by reference.

FIELD

The embodiment discussed herein is related to a rack mount device.

BACKGROUND

There is a rack mount device for housing an electronic device such as a server in a rack. This type of rack mount device is disclosed in, for example, Japanese Laid-open Patent Publication No. 2001-244663 and Japanese Laid-open Patent Publication No. 2012-94708. This type of rack mount device includes, for example, a rail which is provided in a rack and guides an electronic device into the rack and a claw-shaped hooking portion which is provided at an end portion of the rail and is hooked to a rear lower surface of the electronic device. When the electronic device is drawn out from the rack, the hooking portion is hooked to the rear lower surface of the electronic device, so that the electronic device is stopped from dropping off from the rail.

SUMMARY

In accordance with an aspect of the embodiments, a rack mount device includes: a support rail which is provided in a rack and which extends in a front-rear direction of the rack; an electronic device which is housed in the rack along the support rail and which is supported by the support rail; an upper support portion which is provided in the rack and which is arranged at a position higher than the support rail; and a holding member which extends obliquely downward from the upper support portion to a side to which the electronic device is drawn out and which holds the electronic device outside of the rack in a state in which the electronic device has been drawn out from the rack along the support rail.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which:

FIG. 10 is a side view illustrating a state in which an electronic device has been drawn out from the rack illustrated in FIG. 9;

FIG. 11 is a side view illustrating a process in which an electronic device is mounted in the rack illustrated in FIG. 1;

DESCRIPTION OF EMBODIMENT

Hereinafter, an embodiment of a technique disclosed by the present application will be described.

Electronic Apparatus

Figure 1:
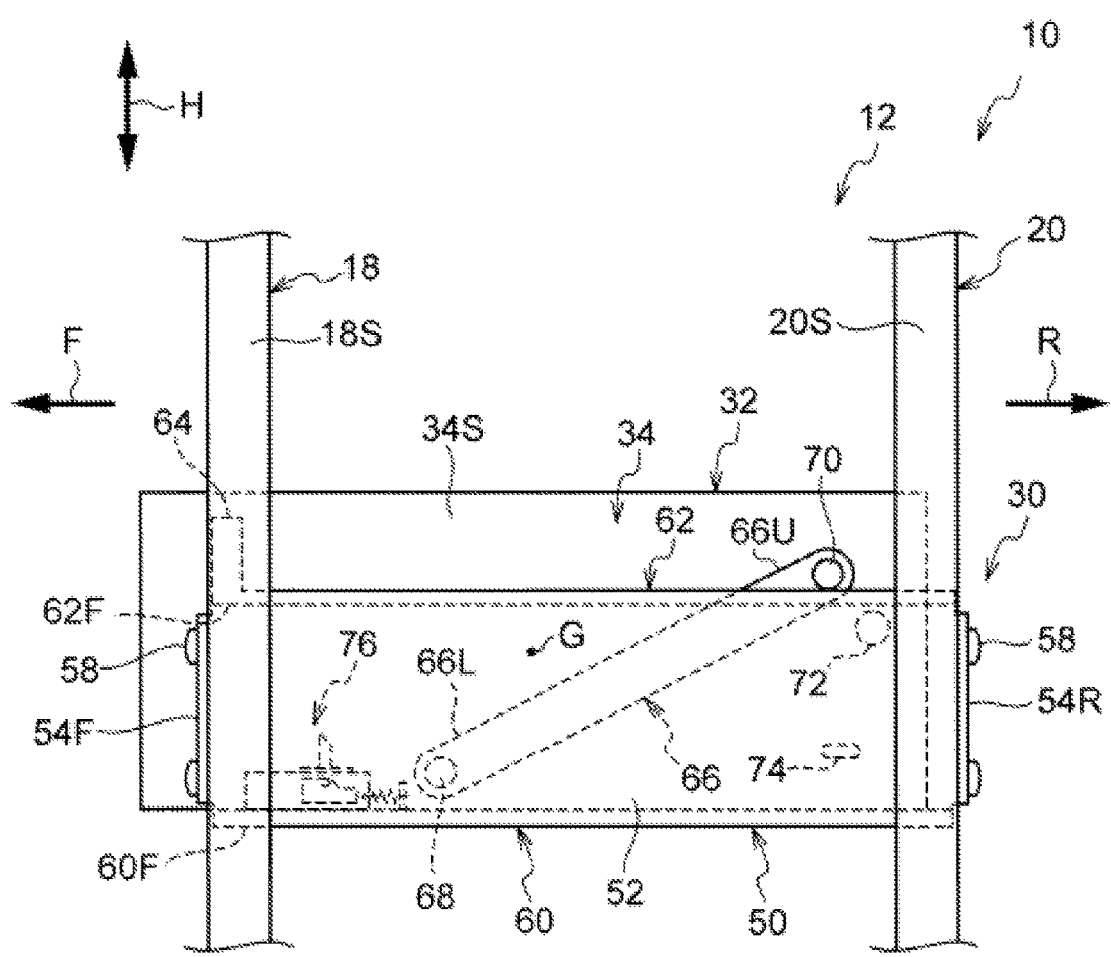
FIG. 1 is a side view of a rack according to an embodiment as seen from outside in the width direction.
Figure 2:
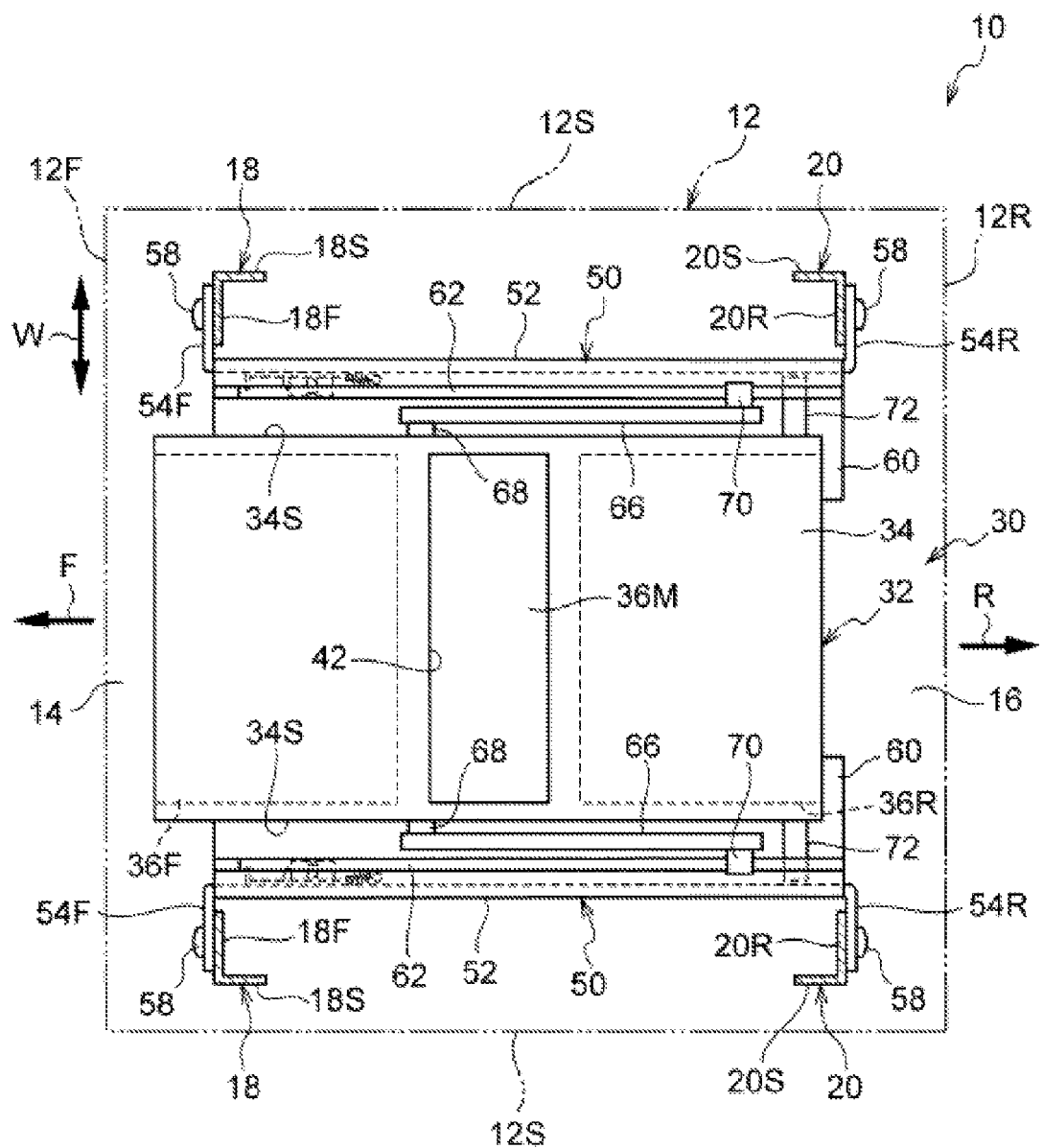
FIG. 2 is a plan view of the rack illustrated in FIG. 1 as seen from above.

As illustrated in FIGS. 1 and 2, an electronic apparatus 10 according to the embodiment includes a rack 12 and a rack mount device 30. An arrow F that is appropriately illustrated in the drawings indicates the front side in the front-rear direction of the rack 12 and an arrow R that is appropriately illustrated in the drawings indicates the rear side in the front-rear direction of the rack 12. An arrow W indicates the width direction of the rack 12 and an arrow H indicates the height direction (the vertical direction) of the rack 12.

Rack

The rack 12 is formed in a box shape. As illustrated in FIG. 2, a housing opening 14 for housing an electronic device 32 described later is formed in a front surface (a front side) 12F of the rack 12. On the other hand, a maintenance opening 16 to expose a rear surface of the electronic device 32 housed (mounted) in the rack 12 is formed in a rear surface (a back surface) 12R of the rack 12.

In FIG. 2, an outer shape of the rack 12 is illustrated by a two-dot chain line. A front door (not illustrated in FIG. 2) that opens and closes the housing opening 14 is attached to the front surface 12F of the rack 12. Further, a rear door (not illustrated in FIG. 2) that opens and closes the opening 16 is attached to the rear surface 12R of the rack 12.

The rack 12 has two sets of a pair of a front rack column 18 and a rear rack column 20. Cross-sectional shapes of the pair of the front rack column 18 and the rear rack column 20 are formed into an L shape. The pair of the front rack column 18 and the rear rack column 20 face each other in the front-rear direction of the rack 12. Further, the pair of the front rack column 18 and the rear rack column 20 are arranged with a space in between in the front-rear direction of the rack 12.

The front rack columns 18 are respectively set up at two corners on the front side (indicated by the arrow F) of the rack 12. Each front rack column 18 has a front wall portion 18F and a side wall portion 18S which are perpendicular to each other. The front wall portion 18F is arranged near the front surface 12F of the rack 12 and the side wall portion 18S is arranged near a side surface 12S of the rack 12.

The rear rack columns 20 are respectively set up at two corners on the rear side (indicated by the arrow R) of the rack 12. Each rear rack column 20 has a rear wall portion 20R and a side wall portion 20S which are perpendicular to each other. The rear wall portion 20R is arranged near the rear surface 12R of the rack 12 and the side wall portion 20S is arranged near the side surface 12S of the rack 12.

Figure 3:
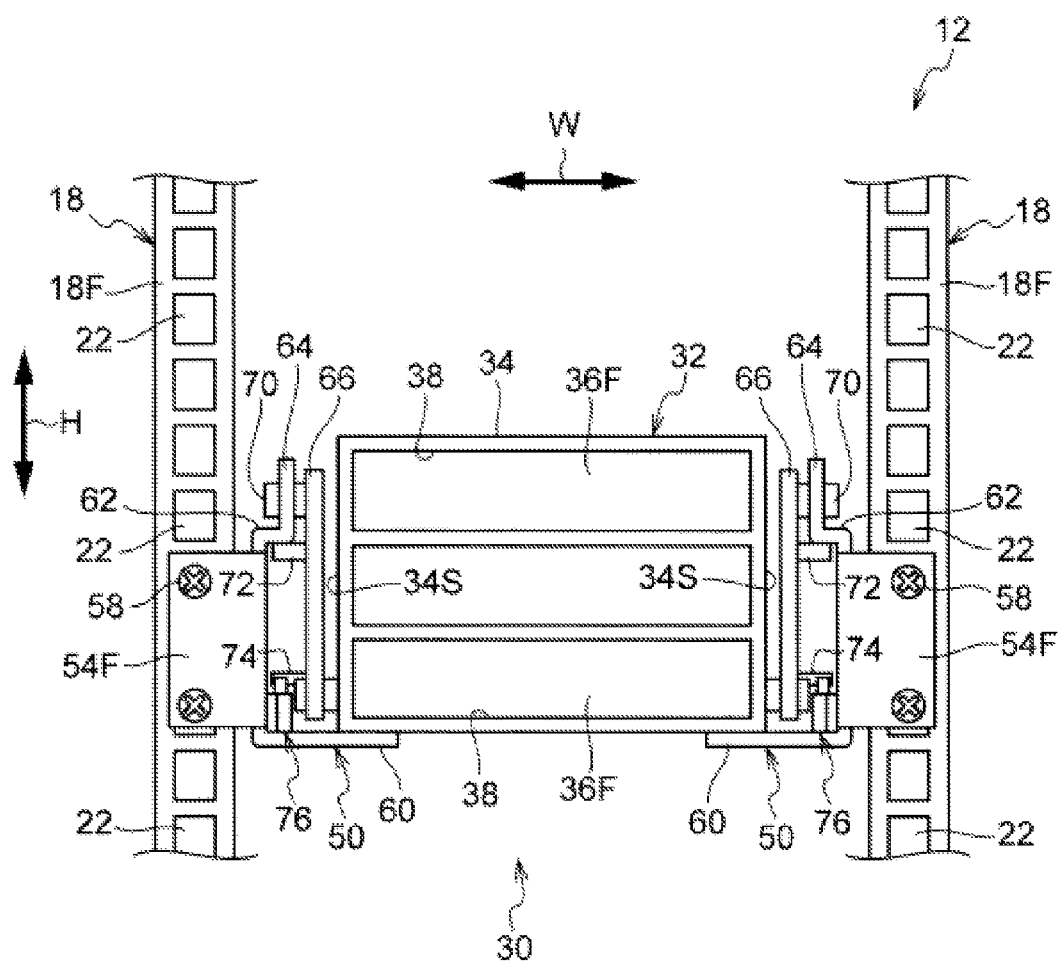
FIG. 3 is a front view (front elevation view) of the rack illustrated in FIG. 1 as seen from front.

As illustrated in FIG. 3, a plurality of attachment openings 22, to which a front end portion of a mount bracket 50 described later is attached, are formed in the front wall portion 18F of the front rack column 18. The plurality of attachment openings 22 are formed into a rectangular shape and arranged at intervals in the height direction (the direction indicated by the arrow H) of the rack 12. In the same manner as this, in the rear wall portion 20R of the rear rack column 20, a plurality of attachment openings (not illustrated in FIG. 3), to which a rear end portion of the mount bracket 50 is attached, are formed at intervals in the height direction of the rack 12.

Rack Mount Device

As illustrated in FIGS. 1 and 2, the rack mount device 30 includes the electronic device 32, a pair of mount brackets 50, and a pair of turning arms 66. The electronic device 32 is housed into the rack 12 from the housing opening 14 formed in the front surface 12F of the rack 12 and is drawn out from the housing opening 14 to the front (the outside) of the rack 12.

The front side in the front-rear direction of the electronic device 32 is indicated by the arrow F in the same manner as the front side in the front-rear direction of the rack 12, and the rear side in the front-rear direction of the electronic device 32 is indicated by the arrow R in the same manner as the rear side in the front-rear direction of the rack 12. The width direction of the electronic device 32 is indicated by the arrow W in the same manner as the width direction of the rack 12. The height direction of the electronic device 32 is indicated by the arrow H in the same manner as the height direction of the rack 12. In the present embodiment, the front side of the rack 12 indicated by the arrow F is defined as a side to which the electronic device 32 is drawn out.

Electronic Device

The electronic device 32 includes a chassis 34, a plurality of front built-in units 36F, a plurality of rear built-in units 36R, and a central built-in unit 36M. The central built-in unit 36M is an example of a built-in unit.

The chassis 34 is formed in a box shape. As illustrated in FIG. 3, a plurality of front unit housing openings 38 are formed in a front surface of the chassis 34. The plurality of front unit housing openings 38 are arranged in the height direction of the electronic device 32. The front built-in units 36F are housed in the front unit housing openings 38, respectively.

A plurality of rear unit housing openings not illustrated in the drawings are formed in a rear surface of the chassis 34. The plurality of rear unit housing openings are arranged in the height direction of the electronic device 32. The rear built-in units 36R are housed in the rear unit housing openings, respectively.

Further, as illustrated in FIG. 2, an upper unit housing opening 42 is formed at the central portion of the upper surface of the chassis 34. The central built-in unit 36M is housed in the upper unit housing opening 42. The central built-in unit 36M is housed in the chassis 34 from the upper unit housing opening 42 formed in the upper surface of the chassis 34 and arranged between the front built-in units 36F and the rear built-in units 36R.

Mount Bracket

As illustrated in FIG. 2, a pair of mount brackets 50 are arranged at both sides of the electronic device 32 in the width direction. Each mount bracket 50 is arranged more inside than a pair of the front rack column 18 and the rear rack column 20 in the width direction of the rack 12. Each mount bracket 50 is bridged over a pair of the front rack column 18 and the rear rack column 20.

The mount bracket 50 includes a bracket main body 52, a front flange portion 54F, a rear flange portion 54R, a support rail 60, a guide rail 62, and an upper support portion 64. The bracket main body 52 is formed in a wall shape and is arranged to face a side surface 34S of the electronic device 32. The bracket main body 52 is arranged over a pair of the front rack column 18 and the rear rack column 20.

The front flange portion 54F extends from a front end portion of the bracket main body 52 to the front of the front rack column 18 and overlaps with the front wall portion 18F of the front rack column 18. The front flange portion 54F is fixed to the front wall portion 18F of the front rack column 18 with, for example, a screw 58.

On the other hand, the rear flange portion 54R extends from a rear end portion of the bracket main body 52 to the rear of the rear rack column 20 and overlaps with the rear wall portion 20R of the rear rack column 20. The rear flange portion 54R is fixed to the rear wall portion 20R of the rear rack column 20 with, for example, a screw 58.

As illustrated in FIG. 3, the support rail 60 is provided along a lower end portion of the bracket main body 52 and extends inside of the rack 12 from the lower end portion in the width direction. The electronic device 32 is mounted on the support rail 60 slidably in the front-rear direction of the rack 12. The electronic device 32 is guided into the rack 12 from the housing opening 14 of the rack 12 by the support rail 60.

The guide rail 62 is provided along an upper end portion of the bracket main body 52 and extends inside of the rack 12 from the upper end portion in the width direction. A slide pin 70 of the turning arm 66 described later is mounted on the guide rail 62 slidably in the front-rear direction of the rack 12. The slide pin 70 is guided into the rack 12 from the housing opening 14 of the rack 12 by the guide rail 62. The guide rail 62 is arranged at a position higher than the center of gravity G of the electronic device 32. The slide pin 70 is an example of a slide portion.

Figure 4:
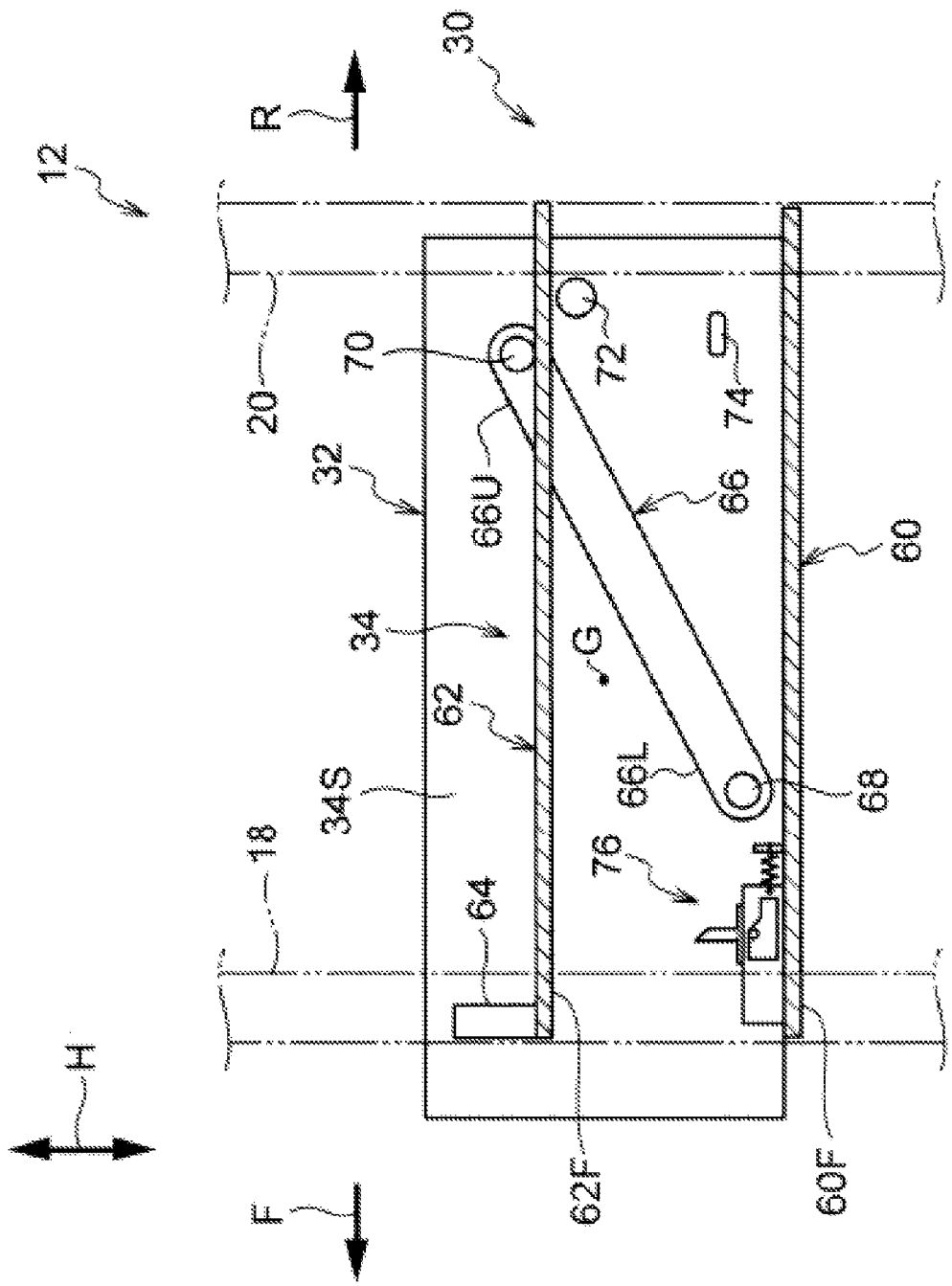
FIG. 4 is a cross-sectional view of the rack illustrated in FIG. 1 as seen from outside in the width direction.

As illustrated in FIG. 4, the upper support portion 64 protrudes upward from a front end portion 62F at the front of the rack 12 in the guide rail 62. The upper support portion 64 is arranged more forward in the rack 12 than the slide pin 70 of the turning arm 66 described later.

Turning Arm

As illustrated in FIG. 3, a pair of turning arms 66 are arranged at both sides of the electronic device 32 in the width direction. As illustrated in FIG. 4, the turning arm 66 is formed in an elongated shape. A lower end portion 66L of the turning arm 66 is connected to the side surface 34S of the chassis 34 of the electronic device 32 through a turning shaft 68.

The turning shaft 68 protrudes outside from the side surface 34S of the chassis 34 in the width direction of the rack 12. The central axis of the turning shaft 68 is arranged along the width direction of the rack 12. In the electronic device 32, the turning shaft 68 is arranged more forward than and lower than the center of gravity G of the electronic device 32. The lower end portion 66L of the turning arm 66 is turned around the turning shaft 68, which is the turning center, with respect to the electronic device 32.

The slide pin 70 is provided in an upper end portion 66U of the turning arm 66 as an example of a slide portion. The slide pin 70 is formed in a cylindrical shape. The slide pin 70 protrudes from the upper end portion 66U of the turning arm 66 to the outside in the width direction of the rack 12 and mounted on the guide rail 62. The central axis of the slide pin 70 is arranged along the width direction of the rack 12. The upper end portion 66U of the turning arm 66 is turned around the slide pin 70, which is the turning center, with respect to the electronic device 32.

Figure 6:
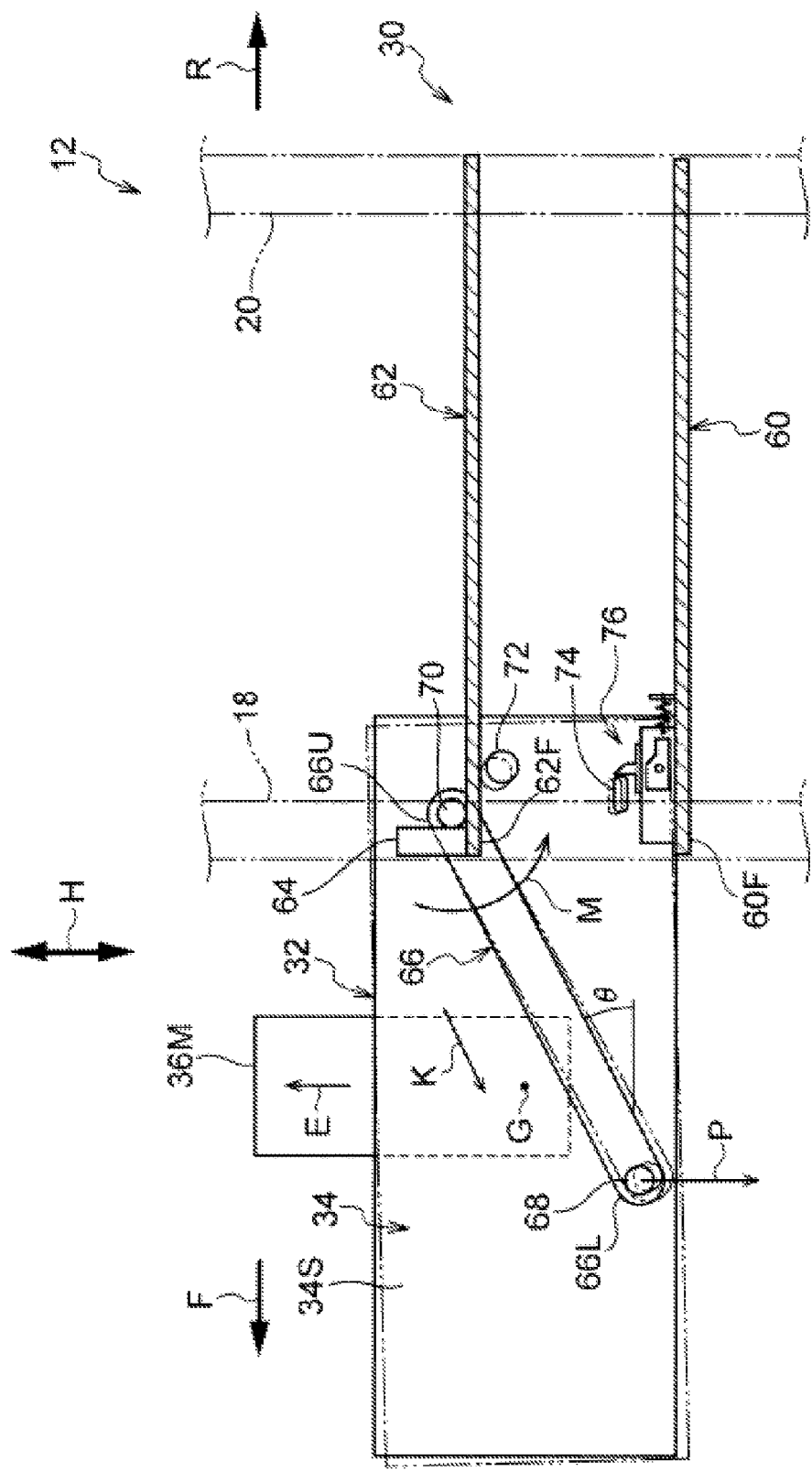
FIG. 6 is a cross-sectional view illustrating a state in which the electronic device has been drawn out from the rack illustrated in FIG. 5.

The slide pin 70 moves toward the front of the rack 12 (as indicated by the arrow F) along the guide rail 62 as the electronic device 32 is drawn out from the rack 12. Then, as illustrated in FIG. 6, in a state in which the electronic device 32 has been drawn out from the rack 12 to the front of the rack 12 along the support rail 60, the electronic device 32 is engaged with the upper support portion 64 of the guide rail 62. In this state, the turning arm 66 extends obliquely downward (in the direction indicated by an arrow K) from the upper support portion 64 to a side to which the electronic device 32 is drawn out and holds a front portion of the electronic device 32 outside of the rack 12. The turning arm 66 is an example of a holding member.

Upper Protrusion Portion

An upper protrusion portion 72, which is an example of an upper engaging portion, is provided on both side surfaces 34S of the electronic device 32. The upper protrusion portion 72 protrudes from the side surface 34S in a rear portion of the electronic device 32 to the outside in the width direction of the rack 12 and is arranged below the guide rail 62. In other words, the guide rail 62 is arranged above the upper protrusion portion 72. The upper protrusion portion 72 is engaged with the guide rail 62 in the height direction of the rack 12 in a state in which the electronic device 32 has been drawn out from the rack 12 as illustrated by a two-dot chain line in FIG. 6. The guide rail 62 is an example of an upper engaged portion.

Lower Protrusion Portion

A lower protrusion portion 74, which is an example of a lower engaging portion, is provided on both side surfaces 34S of the electronic device 32. The lower protrusion portion 74 is provided lower than the upper protrusion portion 72. The lower protrusion portion 74 protrudes from a rear portion of the side surface 34S of the electronic device 32 to the outside in the width direction of the rack 12. The lower protrusion portion is an example of a lower engaging portion.

Figure 7A:
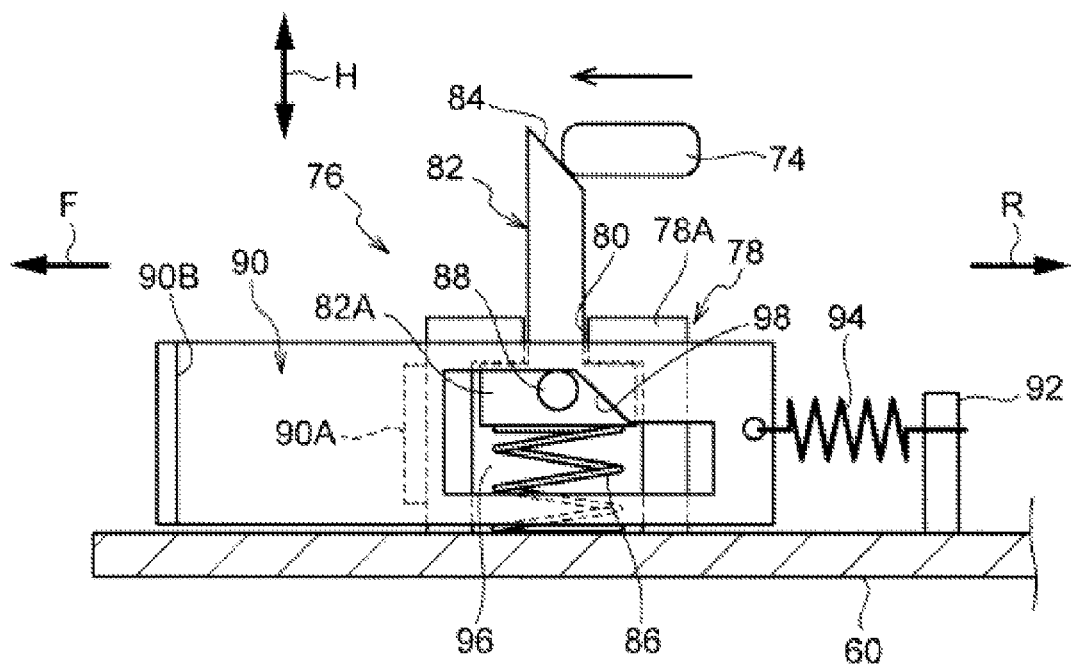
FIG. 7A is an enlarged side view of a lock mechanism illustrated in FIG. 5.

A lock mechanism 76 is provided in a front portion of the support rail 60. As illustrated in FIG. 7A, the lock mechanism 76 includes a fixed base 78, a lock pin 82, and a lock release member 90. The lock pin 82 is an example of a lower engaged portion.

A lower portion of the fixed base 78 is formed into a U shape, whose lower portion is opened, and is fixed to an upper surface of the support rail 60. In an upper wall portion 78A of the fixed base 78, a through hole 80 that penetrates the upper wall portion 78A in the height direction of the rack 12 is formed.

The lock pin 82 is inserted into the through hole 80 of the fixed base 78. The lock pin 82 may move along the through hole 80 in the height direction of the rack 12. At an upper end portion of the lock pin 82, an inclined surface 84 is formed, which is pressed down by the lower protrusion portion 74 as the electronic device 32 is drawn out from the rack 12. The inclined surface 84 is inclined so that as a point on the inclined surface 84 moves from a lower position to an upper position of the lock pin 82, the point moves toward the front of the rack 12.

At the lower end portion of the lock pin 82, a locking portion 82A is provided, which is locked to a lower surface of the upper wall portion 78A of the fixed base 78. An elastic body 86 such as a coil spring is provided between the locking portion 82A and the support rail 60. The lock pin 82 is urged to the upper wall portion 78A of the fixed base 78 at all times by the elastic body 86, and a state is maintained in which the locking portion 82A is locked to the upper wall portion 78A. A pressing object portion 88 having a protruded shape which is pressed down by an inclined surface 98 of a lock release member 90 described later is provided to the locking portion 82A.

The lock release member 90 is arranged on the support rail 60 and may move in the front-rear direction of the rack 12 along the support rail 60. The rear end portion of the lock release member 90 is connected to a support pillar 92 fixed to the guide rail 62 through an elastic body 94 such as a coil spring. The lock release member 90 is urged toward the rear of the rack 12 at all times by the elastic body 94.

An engaging portion 90A is provided to the lock release member 90. When the engaging portion 90A is engaged with the fixed base 78, the lock release member 90 is held at a predetermine position against an urging force of the elastic body 94. A grip portion 90B to be gripped by an operator is provided to the front end portion of the lock release member 90. When the operator pulls the grip portion 90B toward the front of the rack 12 against the urging force of the elastic body 94, the lock release member 90 moves toward the front of the rack 12 along the support rail 60.

At a central portion of the lock release member 90, an opening 96 is formed, into which the pressing object portion 88 of the lock pin 82 is inserted. On the upper edge portion of the opening 96, the inclined surface 98 is formed, which presses down the pressing object portion 88 as the lock release member 90 moves toward the front of the rack 12. The inclined surface 98 is arranged in the rear of the pressing object portion 88 (the side indicated by the arrow R). The inclined surface 98 is inclined so that as a point on the inclined surface 98 moves from a lower position to an upper position in the lock release member 90, the position moves toward the front of the rack 12.

Next, operations of the embodiment will be described.

As illustrated in FIG. 4, the electronic device 32 is housed in the rack 12 in a state in which the electronic device 32 is mounted on a pair of support rails 60. In this state, the center of gravity G of the electronic device 32 is located over the support rails 60. From this state, when the electronic device 32 is drawn out from the rack 12 to the front of the rack 12 (as indicated by the arrow F) along the pair of support rails 60 as illustrated in FIG. 5, the slide pin 70 of the turning arm 66 moves toward the front of the rack 12 along the guide rails 62.

Subsequently, as the electronic device 32 is drawn out, when the center of gravity G of the electronic device 32 is moved to the front of the rack 12 passing through an end portion 60F of the support rail 60 on the side to which the electronic device 32 is drawn out (on the front side of the rack 12), the following occurs.

In other words, as illustrated by a two-dot chain line, the electronic device 32 is turned so that the front end side of the electronic device 32 is located downward with the end portion 60F of the support rail 60 as a fulcrum. In this case, the turning arm 66 is turned with the slide pin 70 and the turning shaft 68 as turning centers. As a result, the upper protrusion portion 72 of the electronic device 32 comes into contact with a lower surface of the guide rail 62, and an upward push-up force S is applied to the guide rail 62 in the height direction of the rack 12. Then, a frictional force $Q_1$ (=the push-up force S×friction coefficient of the lower surface of the guide rail 62) occurs between the upper protrusion portion 72 and the lower surface of the guide rail 62.

Figure 5:
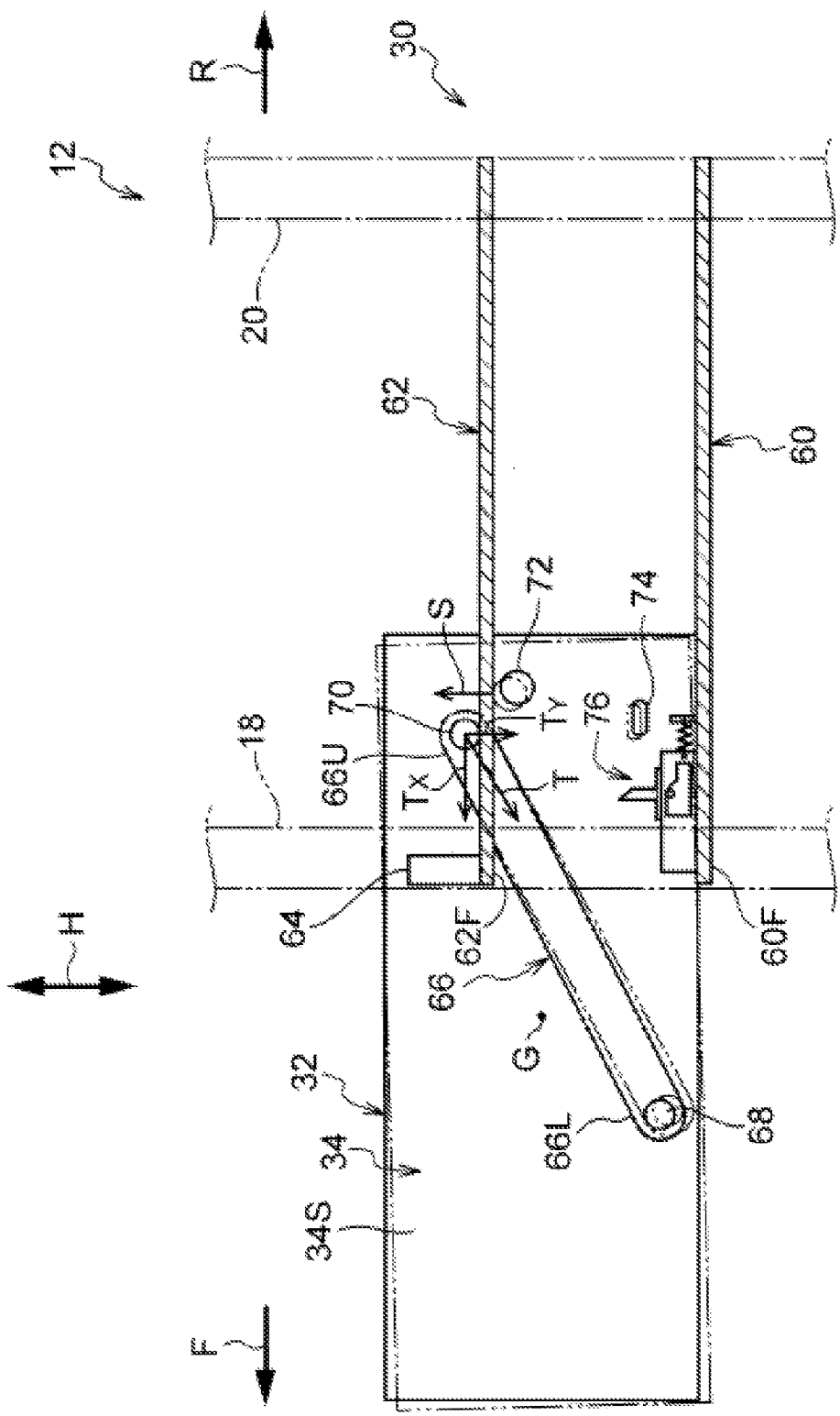
FIG. 5 is a cross-sectional view illustrating a situation in which an electronic device is being drawn out from the rack illustrated in FIG. 4.

In a state illustrated in FIG. 5, a load T along the turning arm 66 is applied to the slide pin 70 from the electronic device 32. The load T is divided into a component force $T_X$ toward the front side in the front-rear direction of the rack 12 and a component force $T_Y$ toward the down side in the height direction of the rack 12. In this case, a frictional force $Q_2$ (=the component force $T_Y$×friction coefficient of the upper surface of the guide rail 62) occurs between the slide pin 70 and the upper surface of the guide rail 62.

Here, when the component force $T_X$<the frictional force $Q_1$+the frictional force $Q_2$, the slide pin 70 does not move toward the front of the rack 12 and the electronic device 32 is held at a predetermined position in the rack 12. On the other hand, when the component force $T_X$ the ≥frictional force $Q_1$+the frictional force $Q_2$, the slide pin 70 moves toward the front of the rack 12.

Subsequently, as illustrated in FIG. 6, when the electronic device 32 is further moved toward the front of the rack 12 (as indicated by the arrow F), the slide pin 70 and the upper support portion 64 are engaged with each other in the front-rear direction of the rack 12 in a state in which the rear of the electronic device 32 is mounted on the end portion 60F of the support rail 60.

Thereby, the movement of the slide pin 70 toward the front of the rack 12 is limited by the upper support portion 64, and the electronic device 32 is held in a state in which the electronic device 32 has been drawn out from the rack 12. In this state, the electronic device 32 is held outside the rack 12 by the turning arm 66 extending obliquely downward from the upper support portion 64 to the side to which the electronic device 32 is drawn out. Further, in a state in which the electronic device 32 has been drawn out from the rack 12, the central built-in unit 36M of the electronic device 32 is exposed from the rack 12. Thereby, it is possible to exchange the central built-in unit 36M as illustrated by an arrow E.

As described above, in the present embodiment, the rear portion of the electronic device 32 is supported by the support rail 60 and the front portion of the electronic device 32 is supported by the turning arm 66 in a state in which the electronic device 32 has been drawn out from the rack 12. Therefore, the electronic device 32 is stopped from falling when the electronic device 32 is drawn out from the rack 12.

Further, the electronic device 32 is supported by the turning arm 66 extending obliquely downward from the upper support portion 64 to the side to which the electronic device 32 is drawn out, so that the weight of the electronic device 32 is efficiently transferred to the rack 12.

Further, the turning arm 66 holds the electronic device 32 at a point in front of the center of gravity G of the electronic device 32. Thereby, in the present embodiment, the electronic device 32 is more stabilized than in a case in which the turning arm 66 holds the electronic device 32 at a point in rear of the center of gravity G of the electronic device 32.

Furthermore, the upper end portion 66U of the turning arm 66 is located higher than the center of gravity G of the electronic device 32 and the lower end portion 66L of the turning arm 66 is located lower than the center of gravity G of the electronic device 32. Therefore, in the present embodiment, an inclination angle θ of the turning arm 66 with respect to the front-rear direction of the rack 12 is greater than in a case in which both of the upper end portion 66U and the lower end portion 66L of the turning arm 66 are located lower than or are located higher than the center of gravity G of the electronic device 32.

Thereby, a moment M applied to the turning arm 66 decreases due to the load (weight) of the electronic device 32 applied to the lower end portion 66L of the turning arm 66. Therefore, the turning arm 66 is stopped from being damaged. In other words, the maximum weight of the electronic device 32 which may be held by the turning arm 66 increases. Thereby, it is possible to increase the size of the electronic device 32 and to perform high density mounting of the central built-in unit 36M and the like in the electronic device 32.

Furthermore, as described above, the central built-in unit 36M is exposed in a state in which the electronic device 32 has been drawn out from the rack 12. Therefore, it is easy to perform maintenance and the like on the central built-in unit 36M. Therefore, in the present embodiment, it is possible to perform high density mounting of built-in units in the electronic device 32 and to easily perform maintenance of the built-in units.

Further, the maximum weight of the electronic device 32 which may be held by the turning arm 66 is adjusted by a mounting position of the turning arm 66 with respect to the electronic device 32 and the inclination angle θ of the turning arm 66. Therefore, a degree of freedom of design of the rack mount device 30 is improved.

Figure 7B:
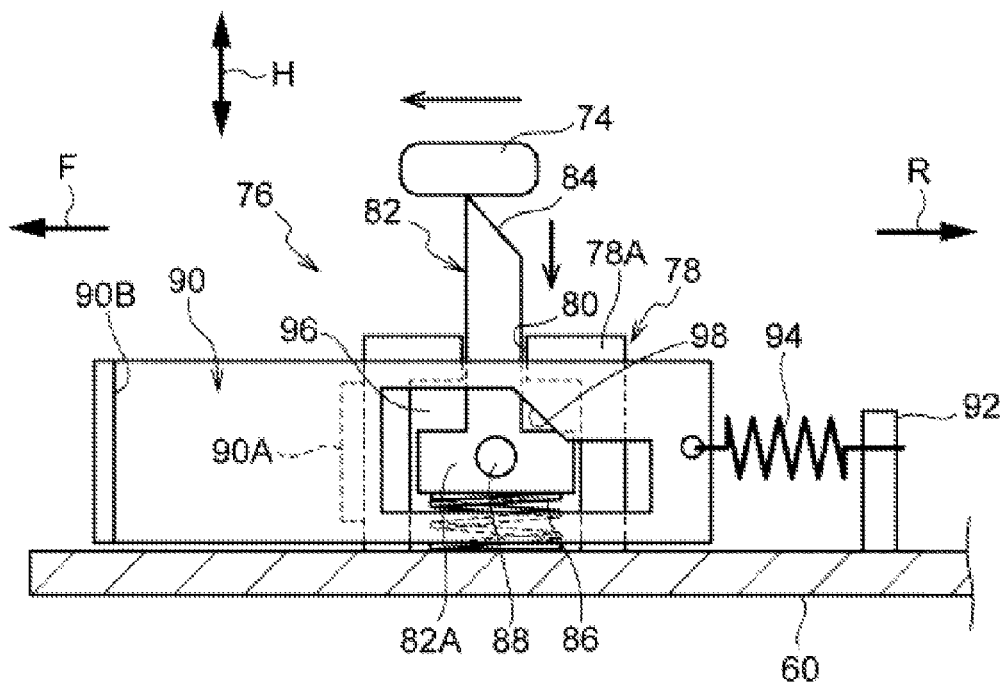
FIG. 7B is a side view illustrating a state in which a lock pin illustrated in FIG. 7A moves downward.
Figure 8A:
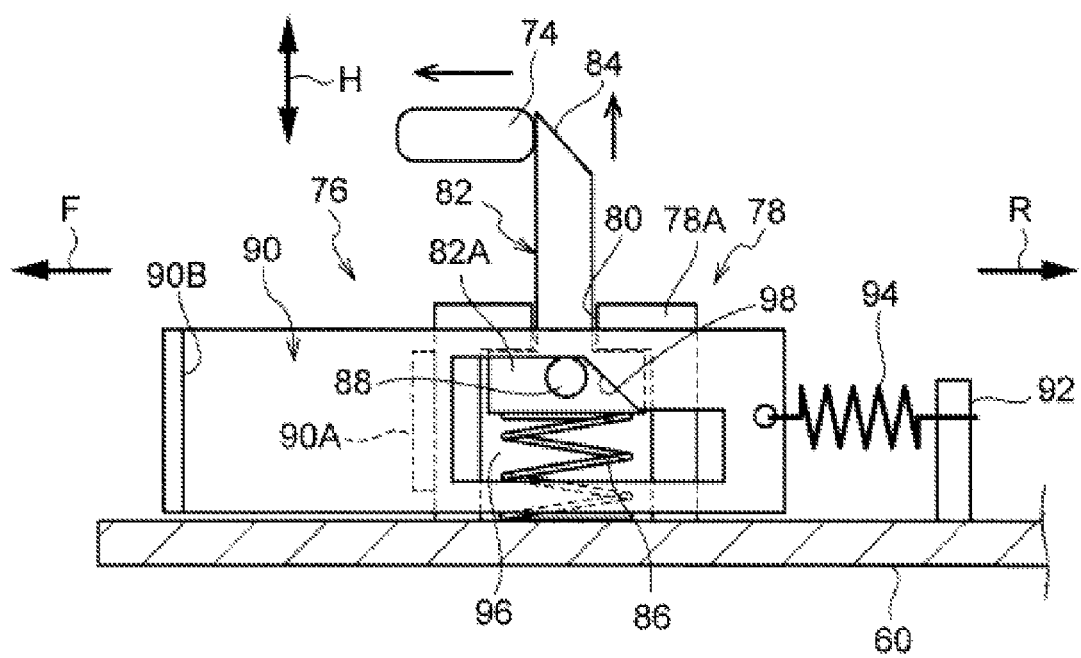
FIG. 8A is a side view illustrating a state in which the lock pin illustrated in FIG. 7B moves upward.

Further, in the present embodiment, as illustrated in FIGS. 7A and 7B, the inclined surface 84 of the lock pin 82 is pressed downward by the lower protrusion portion 74 as the electronic device 32 is drawn out from the rack 12. As illustrated in FIG. 8A, when the lower protrusion portion 74 passes through the lock pin 82 as the electronic device 32 is drawn out from the rack 12, the lock pin 82 is pressed up by an urging force of the elastic body 86. Thereby, the lock pin 82 is arranged in rear of the lower protrusion portion 74 with respect to the rack 12.

In this state, as illustrated by an arrow V in FIG. 6, when the electronic device 32 is turned with the end portion 60F of the support rail 60 as a fulcrum, the lower protrusion portion 74 is engaged with the lock pin 82 in the front-rear direction of the rack 12. Further, in this state, the upper protrusion portion 72 described above is engaged with the guide rail 62 in the height direction of the rack 12. Thereby, the turning of the electronic device 32 is restricted. Therefore, the electronic device 32 is further stopped from falling when the electronic device 32 is drawn out from the rack 12.

Figure 8B:
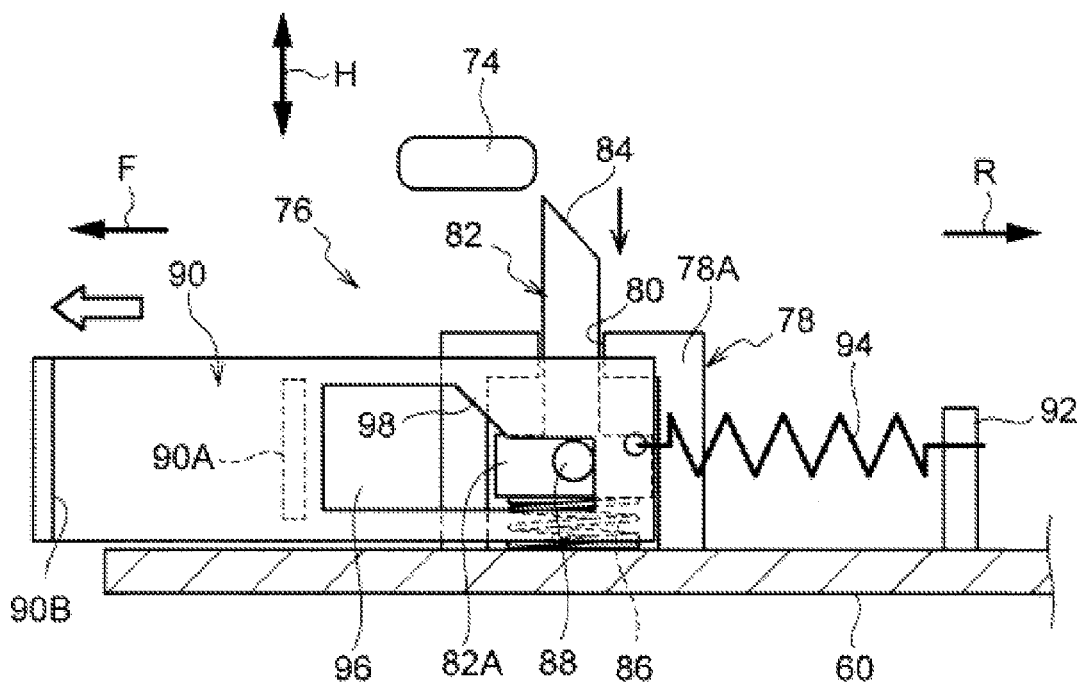
FIG. 8B is a side view illustrating a state in which the lock pin illustrated in FIG. 8A moves downward.

As illustrated in FIG. 8B, for example, when the lock release member 90 is drawn out in front of the rack 12 by an operator, the pressing object portion 88 of the lock pin 82 is pressed down by the inclined surface 98 of the lock release member 90. Thereby, the engaged state between the lower protrusion portion 74 and the lock pin 82 is released. In this state, the electronic device 32 is housed into the rack 12 along the support rail 60. In this case, the slide pin 70 of the turning arm 66 is moved into the rack 12 along the guide rail 62.

Next, operations of the rack mount device 30 according to the present embodiment will be described while comparing with a rack mount device 100 according to a comparative example.

Figure 9:
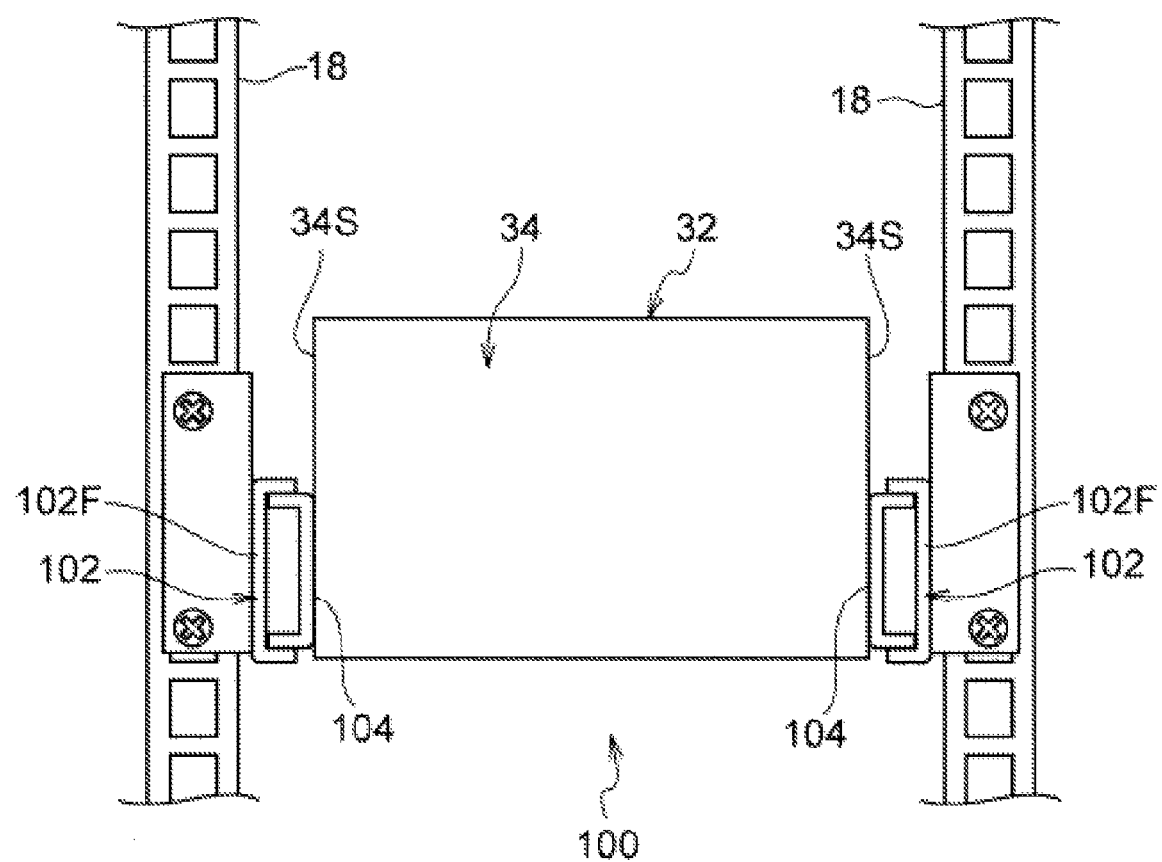
FIG. 9 is a front view (front elevation view) illustrating a rack mount device according to a comparative example.

FIGS. 9 and 10 illustrate the rack mount device 100 according to the comparative example. The rack mount device 100 includes outer rails 102 which are respectively fixed to a pair of front rack column 18 and rear rack column 20 and inner rails 104 which are respectively fixed to the side surfaces 34S of the electronic device 32.

The inner rail 104 is slidably fitted into the outer rail 102. As illustrated in FIG. 10, in a state in which the electronic device 32 has been drawn out from the rack 12, the inner rail 104 supports the electronic device 32 in a state in which a rear end portion 104R of the inner rail 104 is engaged with a front end portion 102F of the outer rail 102.

Therefore, in the rack mount device 100 according to the comparative example, a length of an overlap portion 106 between the rear end portion 104R of the inner rail 104 and the front end portion 102F of the outer rail 102 increases according to the weight of the electronic device 32. When the overlap portion 106 is long, the rear end portion 104R of the inner rail 104 protrudes from the outer rail 102 to the rear of the rack 12 in a state in which the electronic device 32 is housed in the rack 12. In this case, the rear end portion 104R of the inner rail 104 may become an obstacle to wiring and the like of the electronic device 32.

Further, if the cross-sectional areas of the inner rail 104 and the outer rail 102 are increased according to the weight of the electronic device 32, a housing space of the electronic device 32 in the rack 12 may become small.

Further, in the rack mount device 100 according to the comparative example, a large friction force is generated between the outer rail 102 and the inner rail 104, so that it may be difficult for the inner rail 104 to slide with respect to the outer rail 102. As a countermeasure against the above, if ball bearing or the like is provided between the outer rail 102 and the inner rail 104, the structure of the rack mount device 100 may become complicated.

Furthermore, in the rack mount device 100 according to the comparative example, an operator is desired to accurately fit the inner rail 104 into the outer rail 102 while supporting the electronic device 32. Therefore, it may be troublesome to mount the electronic device 32 into the rack 12.

On the other hand, in the present embodiment, as described above, in a state in which the electronic device 32 has been drawn out from the rack 12, the front of the electronic device 32 is supported by the turning arm 66 extending obliquely downward from the upper support portion 64 to the side to which the electronic device 32 is drawn out. Thereby, the weight of the electronic device 32 is efficiently transferred to the rack 12. Therefore, it is possible to reduce the cross-sectional area of the turning arm 66, so that it is possible to increase the housing space of the electronic device 32 in the rack 12. Further, it is possible to increase the size of the electronic device 32 and to perform high density mounting of the front built-in units 36F and the like in the electronic device 32.

Further, in the present embodiment, as illustrated in FIG. 11, when an operator presses the electronic device 32 into the rack 12 (arrow N) in a state in which the rear of the electronic device 32 is mounted on the end portion 60F of the support rail 60, the upper protrusion portion 72 is arranged below the guide rail 62. Therefore, the present embodiment may mount the electronic device 32 into the rack 12 more easily than the rack mount device 100 according to the comparative example.

Next, modified examples of the upper support portion and the turning arm will be described.

Figure 12A:
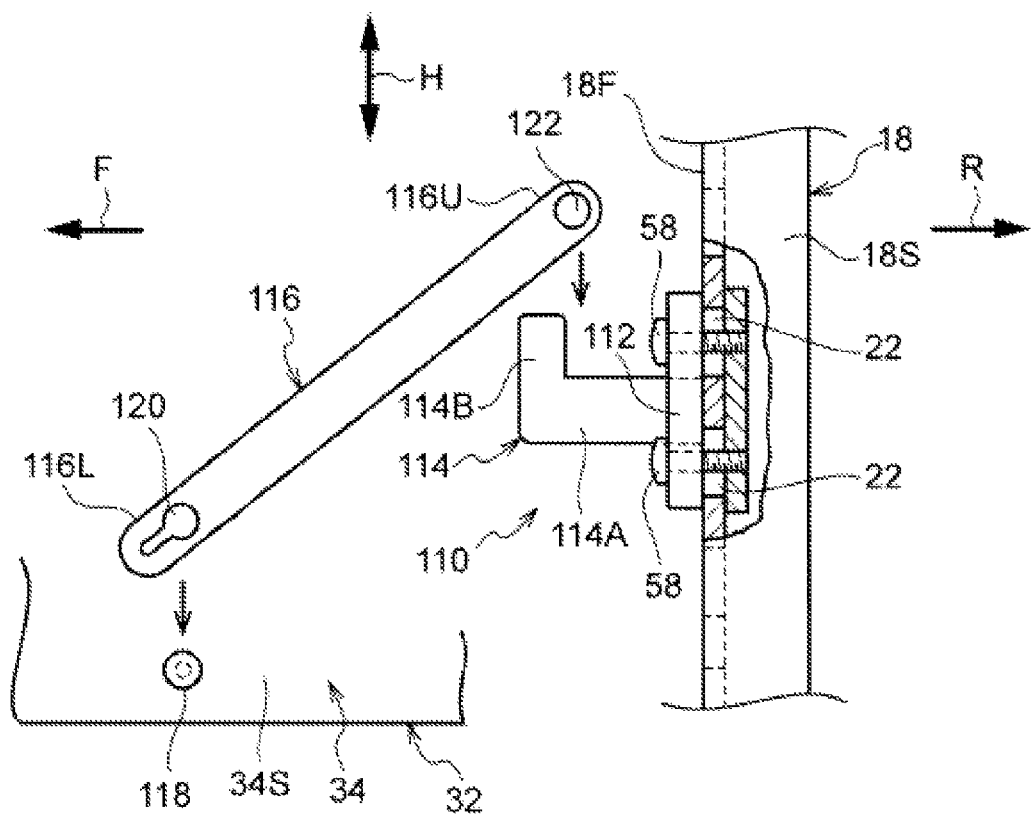
FIG. 12A is a side view illustrating an upper support member attached to a front rack column.
Figure 12B:
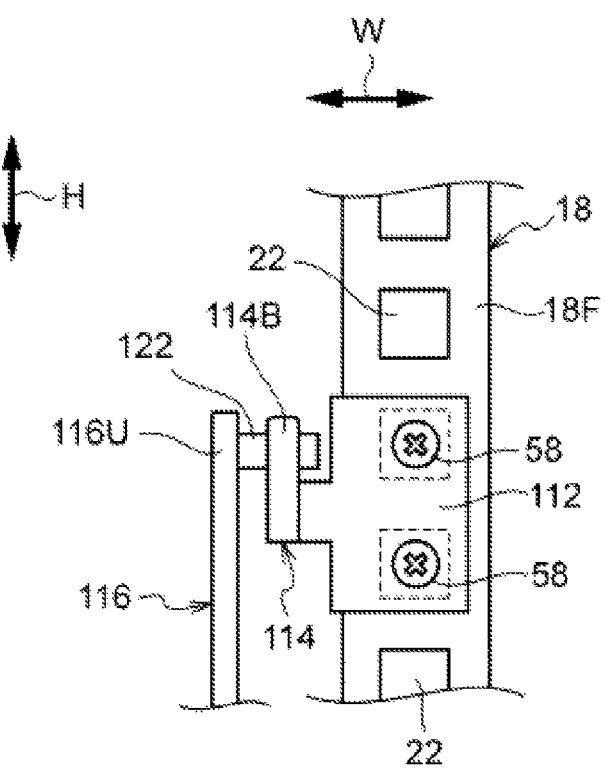
FIG. 12B is a front view illustrating the upper support member illustrated in FIG. 12A.

As illustrated in FIGS. 12A and 12B, an upper support member 110 may be detachably attached to the rack 12. In the same manner, a turning arm 116 may be detachably attached to the rack 12 and the electronic device 32.

Specifically, the upper support member 110 includes a flange portion 112 and a hooking portion 114. The flange portion 112 is formed into a plate shape and is detachably attached to the front wall portion 18F of the front rack column 18 with screws 58 in a state in which the flange portion 112 is stacked on the front wall portion 18F.

The hooking portion 114 is formed in an L shape. The hooking portion 114 includes an arm portion 114A that extends from the flange portion 112 to the front of the rack 12 and an upper support portion 114B that extends from the tip of the arm portion 114A upward in the rack 12.

The turning arm 116 is arranged inside with respect to the hooking portion 114 in the width direction of the rack 12. A fitting hole 120 is formed in a lower end portion 116L of the turning arm 116. A turning shaft 118 protruding from the side surface 34S of the electronic device 32 is inserted into the fitting hole 120, so that the lower end portion 116L of the turning arm 116 is attached to the electronic device 32. Thereby, the lower end portion 116L of the turning arm 116 is turned around the turning shaft 118 with respect to the electronic device 32.

On the other hand, a turning shaft 122 is provided to an upper end portion 116U of the turning arm 116. The turning shaft 122 protrudes from the upper end portion 116U of the turning arm 116 to the outside in the width direction of the rack 12 and is hooked to the hooking portion 114 of the upper support member 110. The upper end portion 116U of the turning arm 116 is turned around the turning shaft 122 with respect to the hooking portion 114.

In this modified example, for example, when the electronic device 32 is drawn out from the rack 12, the upper support member 110 and the turning arm 116 are attached to the rack 12 and the electronic device 32. Therefore, when a plurality of electronic devices 32 are mounted in the rack 12, the upper support member 110 and the turning arm 116 may be shared by the plurality of electronic devices 32. Therefore, component costs of the upper support member 110 and the turning arm 116 are reduced.

Figure 13:
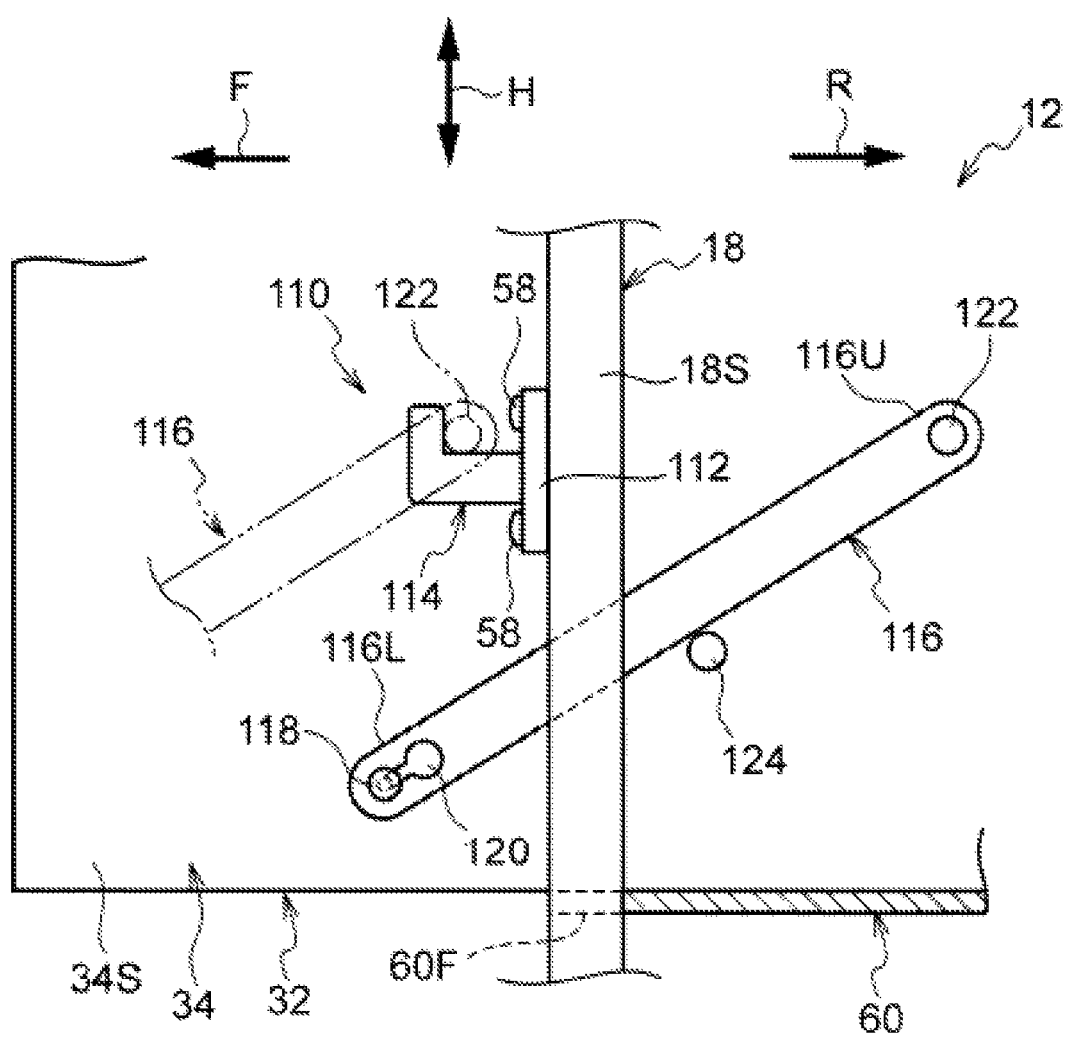
FIG. 13 is a side view illustrating the upper support member illustrated in FIG. 12A.

In a modified example illustrated in FIG. 13, a holding pin 124 that holds the turning arm 116 at a predetermined inclination angle is provided on the side surface 34S of the electronic device 32. In this modified example, when the electronic device 32 to which the turning arm 116 is attached is drawn out from the rack 12, the turning shaft 122 of the turning arm 116 is hooked to the hooking portion 114 of the upper support member 110 as illustrated by a two-dot chain line. Therefore, the turning shaft 122 of the turning arm 116 may be easily hooked to the hooking portion 114.

Figure 14:
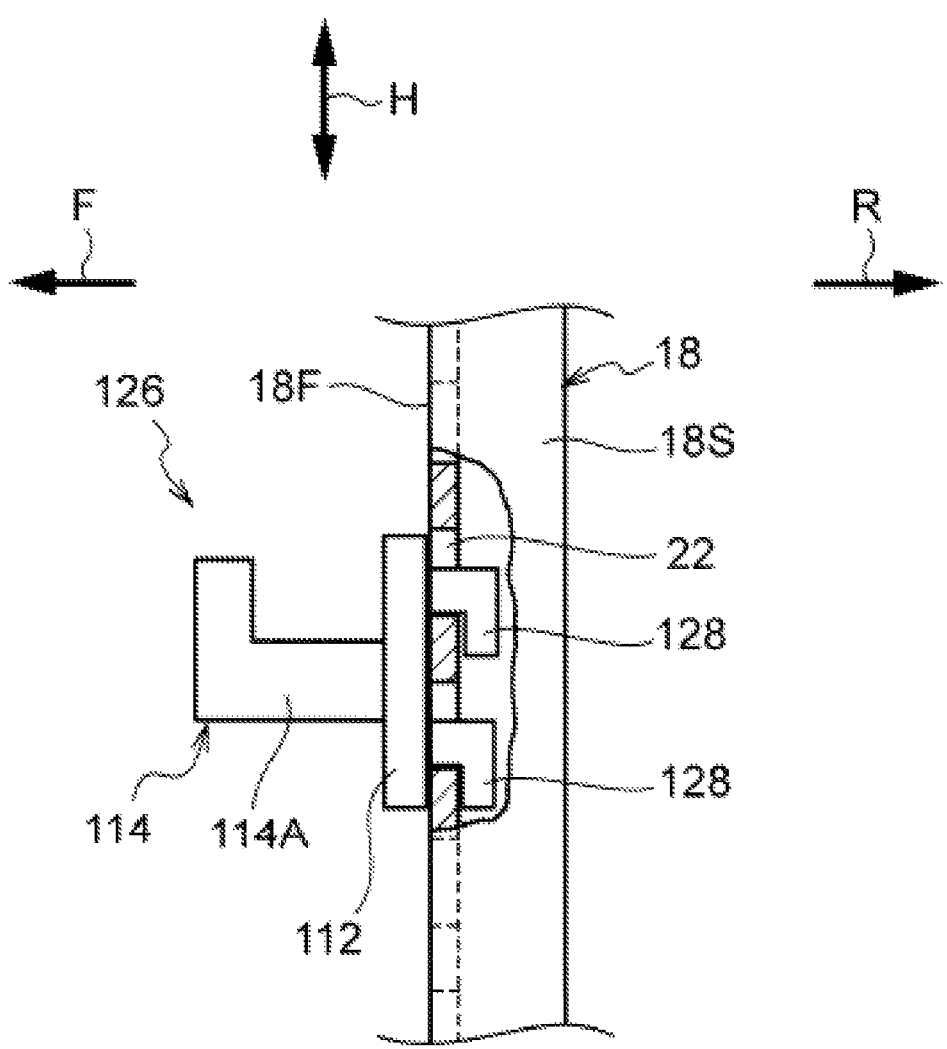
FIG. 14 is a side view illustrating a modified example of the upper support member illustrated in FIG. 12A.

As illustrated in FIG. 14, an upper support member 126 may be attached to the front rack column 18 by claw portions 128 protruded from the flange portion 112 instead of the screws 58 (see FIG. 12A).

Figure 15:
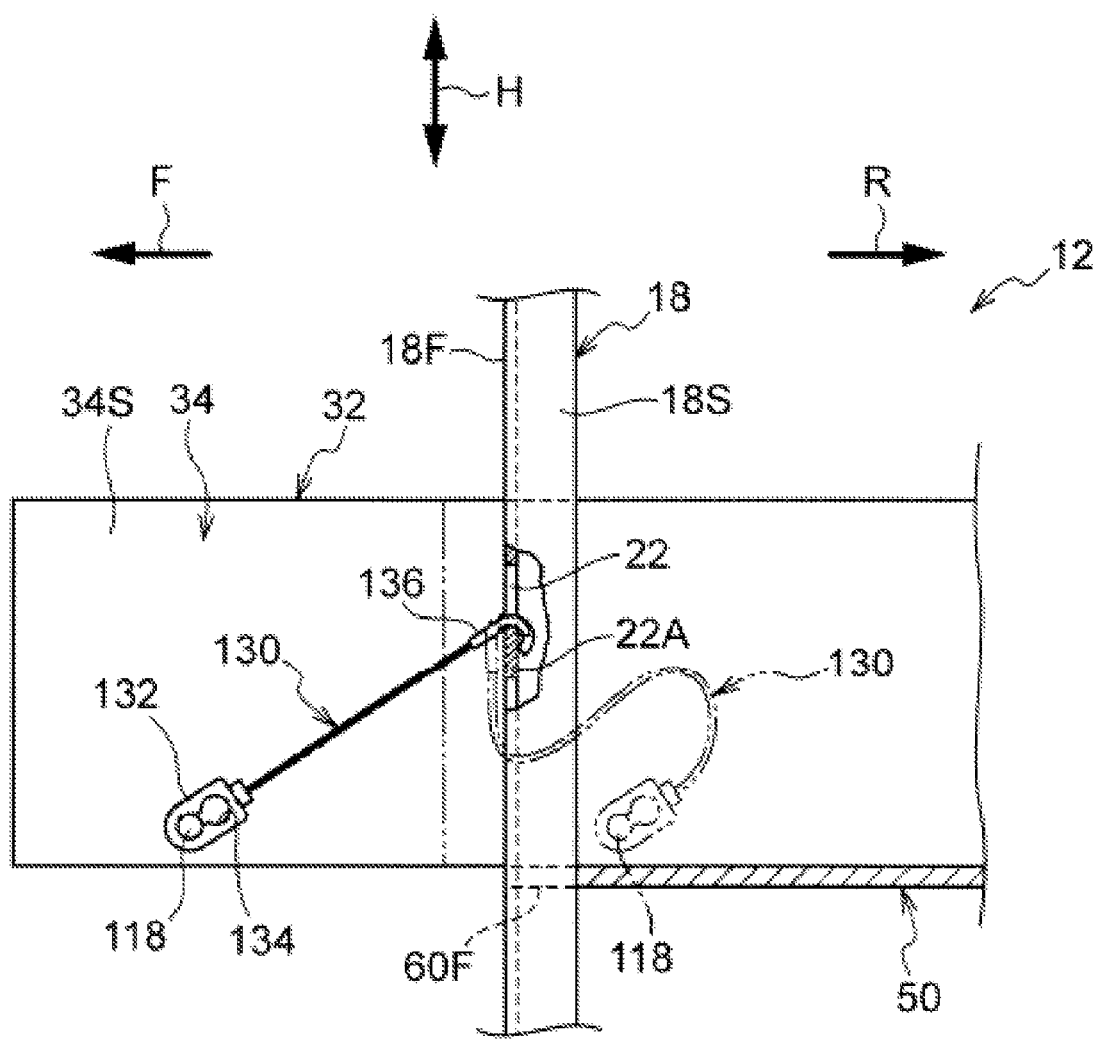
FIG. 15 is a side view illustrating a linear member attached to a front rack column.

Next, in a modified example illustrated in FIG. 15, in a state in which the electronic device 32 has been drawn out from the rack 12, the electronic device 32 is held by a wire member 130 which is an example of a holding member. The wire member 130 is formed into, for example, a wire. An attaching bracket 132 is provided to one end of the wire member 130.

A fitting hole 134 is formed in the attaching bracket 132. The turning shaft 118 protruding from the side surface 34S of the electronic device 32 is inserted into the fitting hole 134, so that the wire member 130 is attached to the electronic device 32. Thereby, the one end of the wire member 130 is turned around the turning shaft 118 with respect to the electronic device 32.

On the other hand, an attaching hook portion 136 is provided to the other end of the wire member 130. The attaching hook portion 136 is formed in a U shape. The attaching hook portion 136 is hooked to a lower edge portion 22A of the attachment opening 22 of the front rack column 18. Thereby, the other end of the wire member 130 is turned around the lower edge portion 22A of the attachment opening 22 with respect to the front rack column 18. The lower edge portion 22A of the attachment opening 22 is an example of an upper support portion.

Here, when the electronic device 32 is drawn out from the rack 12, the wire member 130 is attached to the electronic device 32 and the front rack column 18. In a state in which the electronic device 32 is housed in the rack 12, the wire member 130 is curved.

On the other hand, in a state in which the electronic device 32 has been drawn out from the rack 12, the wire member 130 has a linear shape. In this state, the wire member 130 extends obliquely downward from the lower edge portion 22A of the attachment opening 22 to the side to which the electronic device 32 is drawn out and holds the electronic device 32 outside of the rack 12. Therefore, in the same manner as in the embodiment described above, the electronic device 32 is stopped from dropping off from the rack 12.

Figure 16:
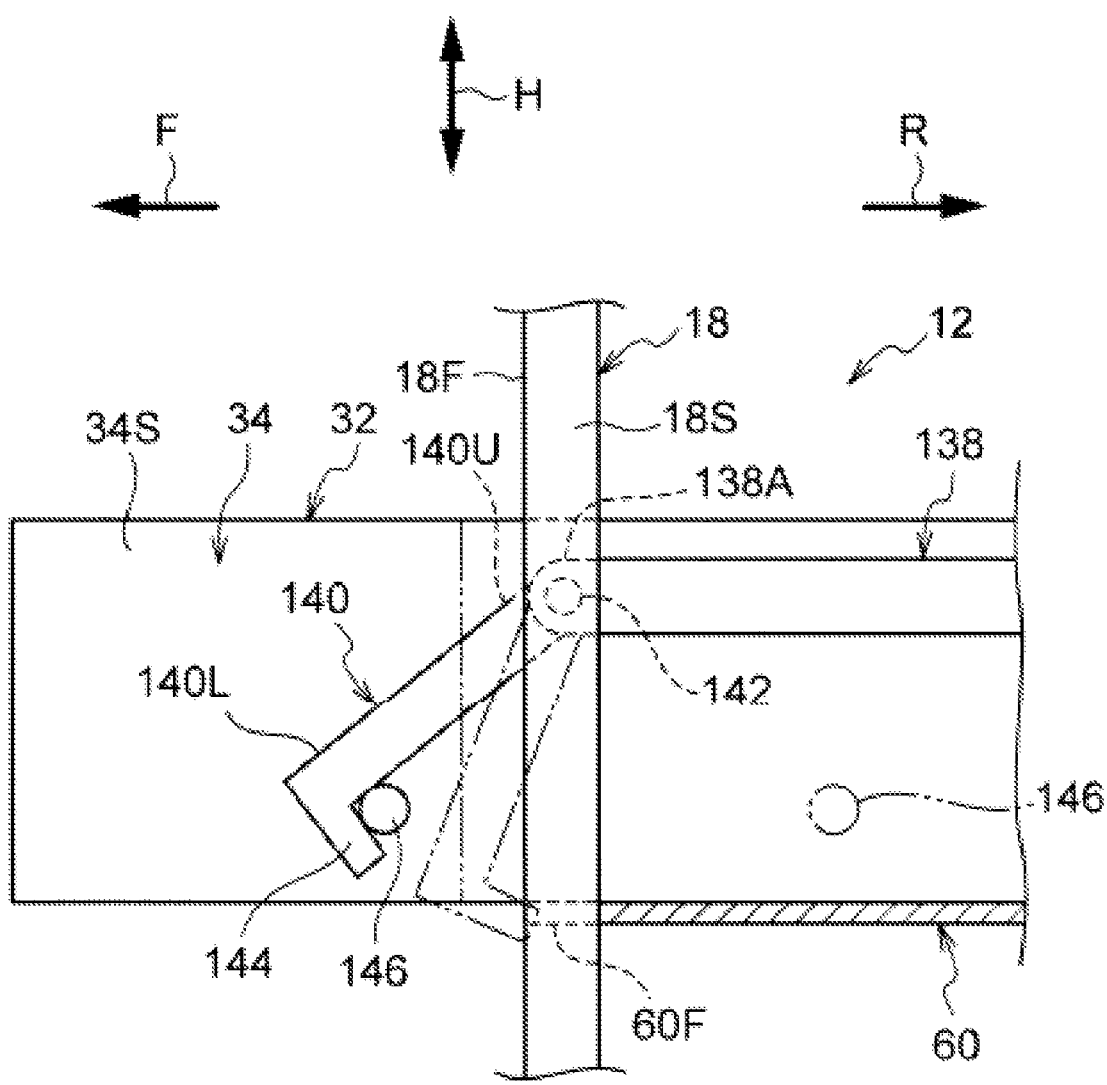
FIG. 16 is a side view illustrating a turning arm attached to the front rack column.

Next, in a modified example illustrated in FIG. 16, in a state in which the electronic device 32 has been drawn out from the rack 12, the electronic device 32 is held by a turning arm 140 which is an example of a holding member.

Specifically, a transverse frame 138 is laid between the pair of the front rack column 18 and the rear rack column 20 (see FIG. 2). A held pin 146 protruding from the side surface 34S of the electronic device 32 is provided to the side surface 34S. The held pin 146 is an example of a held portion.

An upper end portion 140U of the turning arm 140 is connected to an end portion 138A of the transverse frame 138 on the drawing-out side of the electronic device 32 (at the front of the rack 12) through a turning shaft 142. Thereby, the upper end portion 140U of the turning arm 140 is turned around the turning shaft 142 with respect to the front rack column 18. The end portion 138A of the transverse frame 138 is an example of an upper support portion.

A hook portion 144 is provided to a lower end portion 140L of the turning arm 140. The hook portion 144 is formed in an L shape. As illustrated by a two-dot chain line, the hook portion 144 is arranged in front of the held pin 146 with respect to the rack 12 in a state in which the electronic device 32 is housed in the rack 12.

Here, the held pin 146 is hooked by the hook portion 144 when the electronic device 32 is drawn out from the rack 12. In this state, when the electronic device 32 is further drawn out from the rack 12, the upper end portion 140U of the turning arm 140 is turned around the turning shaft 142. Then, in a state in which the electronic device 32 has been drawn out from the rack 12, the turning arm 140 extends obliquely downward from the end portion 138A of the transverse frame 138 to the side to which the electronic device 32 is drawn out and holds the held pin 146 outside the rack 12. Therefore, in the same manner as in the embodiment described above, the electronic device 32 is stopped from dropping off from the rack 12.

Figure 17:
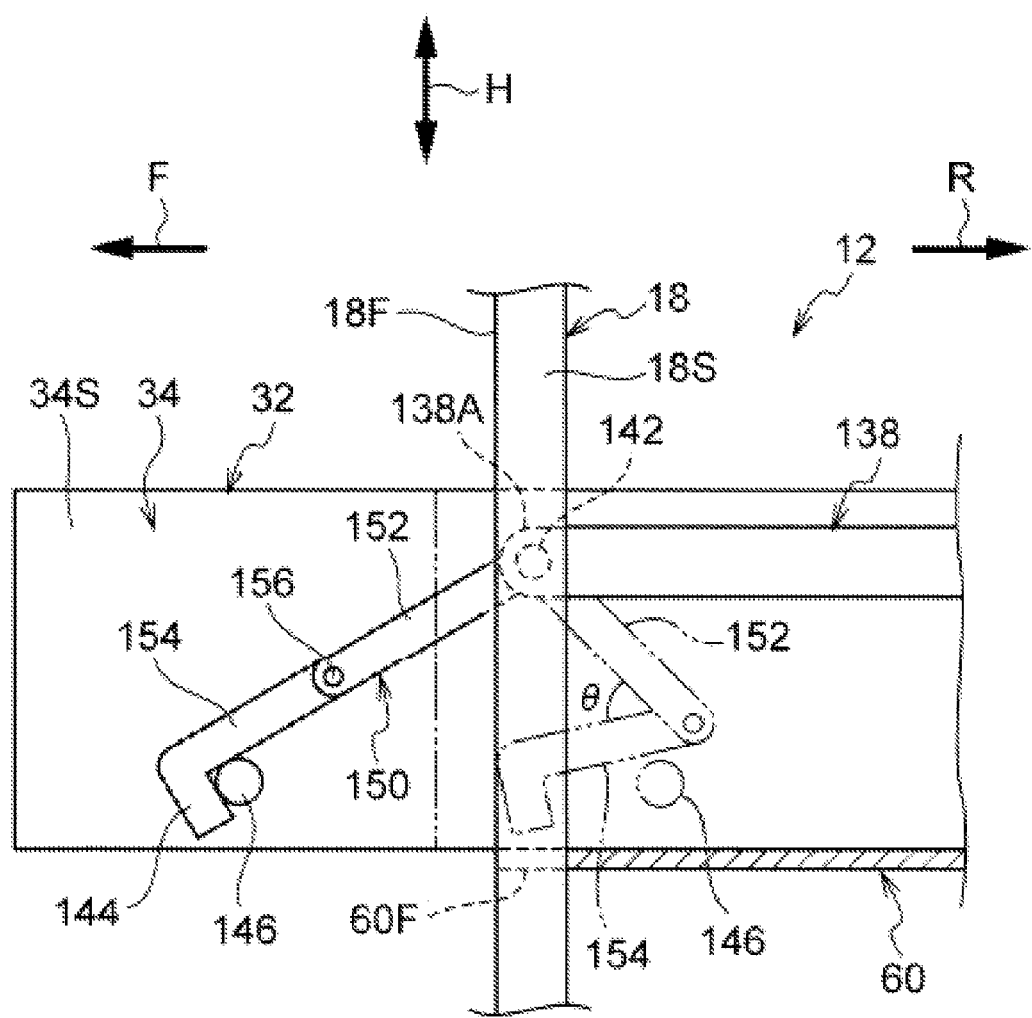
FIG. 17 is a side view illustrating a turning arm attached to the front rack column.

In a modified example illustrated in FIG. 17, a turning arm 150 has an upper link member 152 and a lower link member 154. An upper end portion of the upper link member 152 is connected to the end portion 138A of the transverse frame 138 through the turning shaft 142.

An upper end portion of the lower link member 154 is connected to a lower end portion of the upper link member 152 through the turning shaft 156. Thereby, the upper link member 152 and the lower link member 154 may rotate with each other. A hook portion 144 is provided to a lower end portion of the lower link member 154.

Here, in a state in which the electronic device 32 is housed in the rack 12, as illustrated by a two-dot chain line, the turning arm 150 is bent so that the upper link member 152 and the lower link member 154 make a predetermined angle θ. Therefore, in the present modified example, it is possible to reduce a housing space of the turning arm 150.

On the other hand, in a state in which the electronic device 32 has been drawn out from the rack 12, the upper link member 152 and the lower link member 154 are linearly arranged. The turning arm 150 extends obliquely downward from the end portion 138A of the transverse frame 138 to the side to which the electronic device 32 is drawn out and holds the held pin 146 outside of the rack 12. Therefore, in the same manner as in the embodiment described above, the electronic device 32 is stopped from dropping off from the rack 12.

Next, a modified example of the lock mechanism will be described.

Figure 18A:
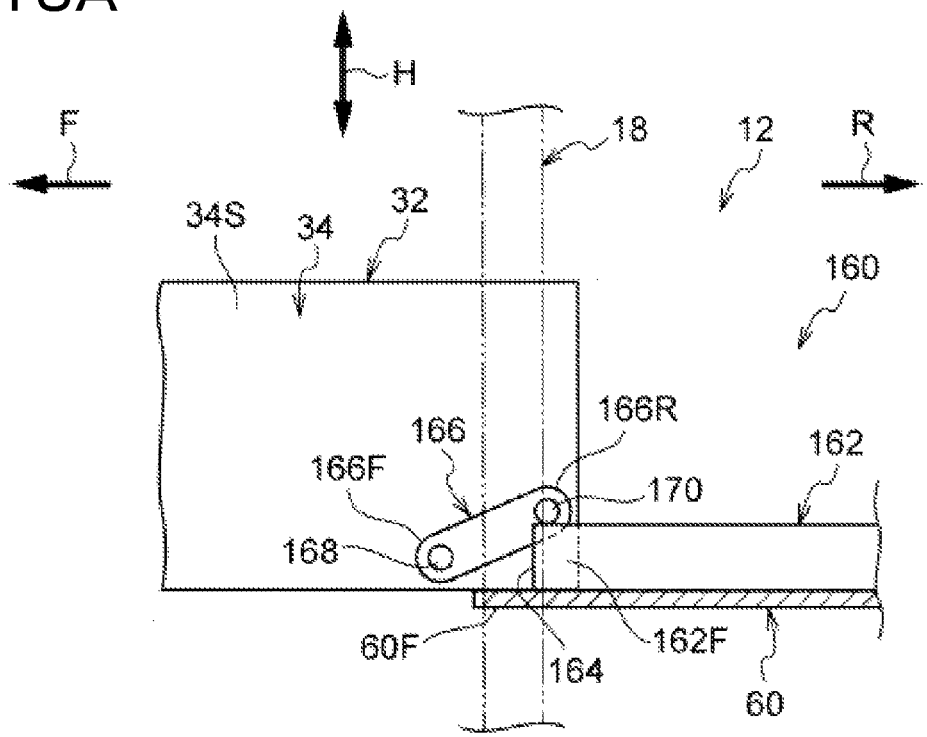
FIG. 18A is a side view illustrating a modified example of the lock mechanism illustrated in FIG. 4.

A lock mechanism 160 illustrated in FIG. 18A includes a lock rail 162 and a rotary lock member 166. The lock rail 162 extends in the front-rear direction of the rack 12 and is arranged on the support rail 60.

An end portion 162F of the lock rail 162 on the side to which the electronic device 32 is drawn out (at the front of the rack 12) is arranged in rear of the end portion 60F of the support rail 60 with respect to the rack 12. Thereby, a step portion 164 is formed between the end portion 162F of the lock rail 162 and the end portion 60F of the support rail 60. The step portion 164 is an example of a lower engaged portion.

The rotary lock member 166 is formed in a long shape and is arranged inside with respect to the lock rail 162 in the width direction of the rack 12. One end portion (front end portion) 166F of the rotary lock member 166 on the side to which the electronic device 32 is drawn out (at the front of the rack 12) is connected to the side surface 34S in a rear portion of the electronic device 32 through a turning shaft 168. The one end portion 166F of the rotary lock member 166 is turned around the turning shaft 168 with respect to the electronic device 32.

On the other hand, a slide lock portion 170 is provided at the other end portion (rear end portion) 166R of the rotary lock member 166 on the side opposite to the side to which the electronic device 32 is drawn out (on the side facing the rear of the rack 12). The slide lock portion 170 protrudes from the other end portion 166R of the rotary lock member 166 to the outside in the width direction of the rack 12 and mounted on the lock rail 162. The slide lock portion 170 moves toward the front of the rack 12 along the lock rail 162 as the electronic device 32 is drawn out from the rack 12.

Figure 18B:
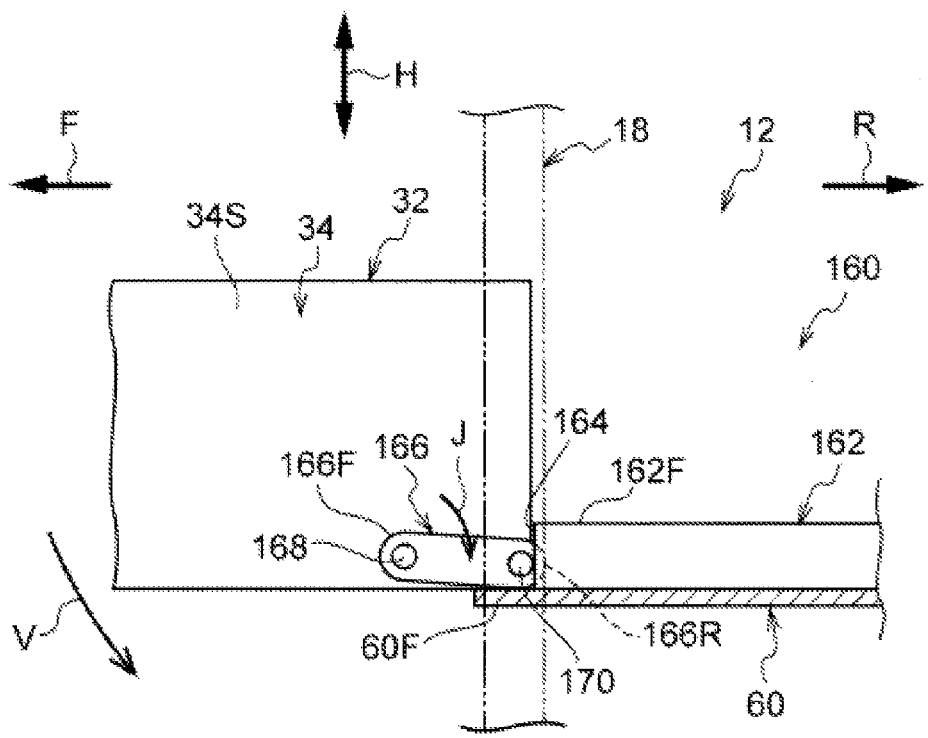
FIG. 18B is a side view illustrating a state in which an electronic device has been drawn out from the rack illustrated in FIG. 18A.

Then, as illustrated in FIG. 18B, in a state in which the electronic device 32 has been drawn out from the rack 12, as illustrated by an arrow J, the slide lock portion 170 is dropped by its own weight from the end portion 162F of the lock rail 162 and is dropped into the step portion 164. In this state, as illustrated by an arrow V, when the electronic device 32 is turned with the end portion 60F of the support rail 60 as a fulcrum, the slide lock portion 170 is engaged with the step portion 164 in the front-rear direction of the rack 12. Thereby, the turning of the electronic device 32 (in the direction indicated by the arrow V) is limited and the electronic device 32 is stopped from dropping off from the rack 12.

On the other hand, when the electronic device 32 is housed in the rack 12, an operator lifts the other end portion 166R of the rotary lock member 166 and releases the engaged state between the slide lock portion 170 and the step portion 164. Thereby, it is possible to house the electronic device 32 in the rack 12. The slide lock portion 170 is an example of a lower engaging portion.

Figure 19A:
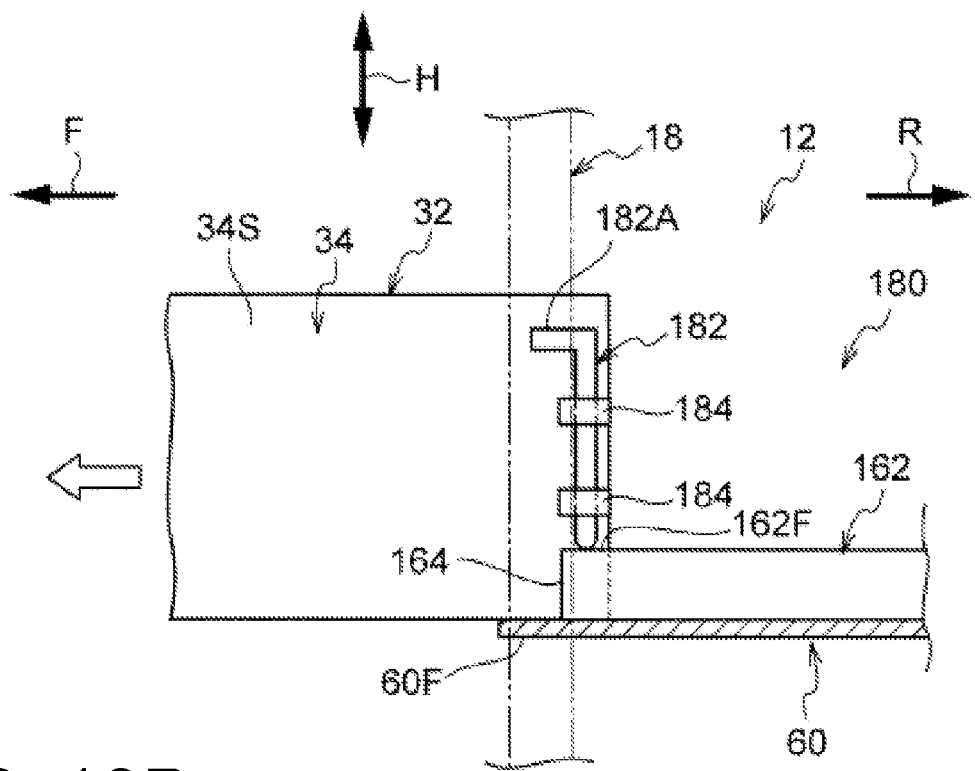
FIG. 19A is a side view illustrating a modified example of the lock mechanism illustrated in FIG. 4.

Next, a lock mechanism 180 illustrated in FIG. 19A includes a lock rail 162 and a lock pin 182. The lock pin 182 is an example of a lower engaging portion.

The lock pin 182 is attached to the side surface 34S in a rear portion of the electronic device 32 slidably in the height direction of the rack 12 through a pair of brackets 184. The lock pin 182 is mounted on the lock rail 162 in a state in which the electronic device 32 is housed in the rack 12. A locking portion 182A for not being dropped is provided to an upper end portion of the lock pin 182. The locking portion 182A is locked to an upper bracket 184 of the pair of brackets 184 arranged in the height direction of the rack 12.

Figure 19B:
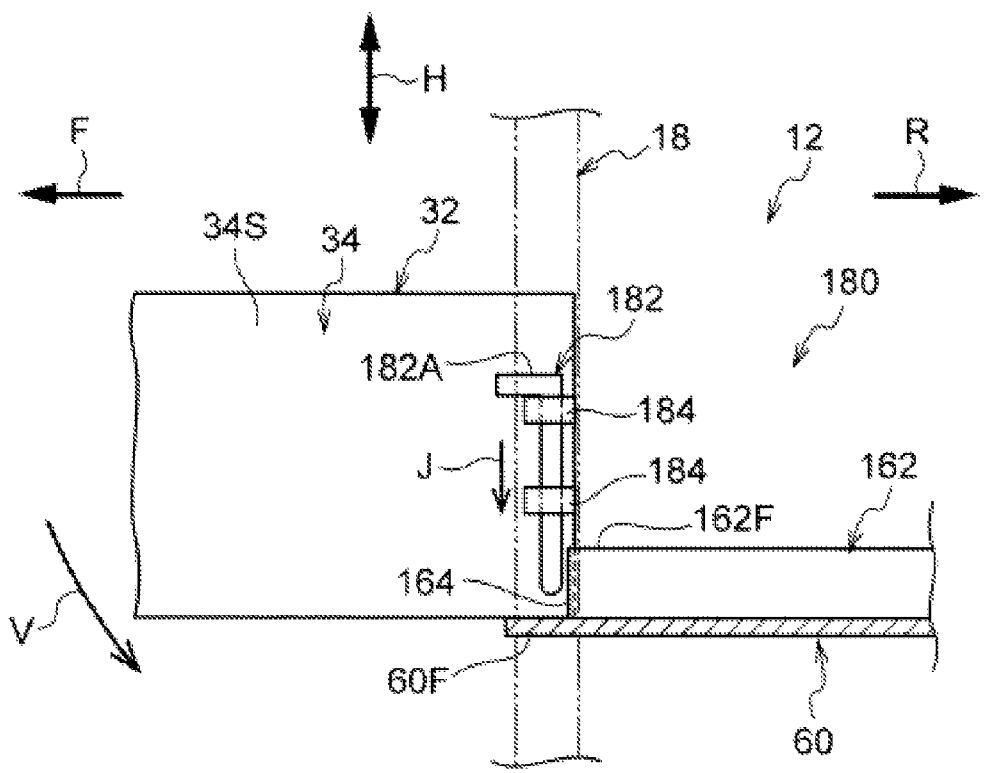
FIG. 19B is a side view illustrating a state in which an electronic device has been drawn out from the rack illustrated in FIG. 19A.

The lock pin 182 moves toward the front of the rack 12 along the lock rail 162 as the electronic device 32 is drawn out from the rack 12. Then, as illustrated in FIG. 19B, in a state in which the electronic device 32 has been drawn out from the rack 12, as illustrated by an arrow J, the slide lock portion 170 is dropped by its own weight from the end portion 162F of the lock rail 162 and is dropped into the step portion 164. Thereby, the locking portion 182A of the lock pin 182 is locked to the upper bracket 184.

In this state, as illustrated by an arrow V, when the electronic device 32 is turned with the end portion 60F of the support rail 60 as a fulcrum, a lower end portion of the lock pin 182 is engaged with the step portion 164 in the front-rear direction of the rack 12. Thereby, the turning of the electronic device 32 (in the direction indicated by the arrow V) is limited and the electronic device 32 is stopped from dropping off from the rack 12.

On the other hand, when the electronic device 32 is housed in the rack 12, an operator lifts the locking portion 182A and releases the engaged state between the lock pin 182 and the step portion 164. Thereby, it is possible to house the electronic device 32 in the rack 12.

Figure 20A:
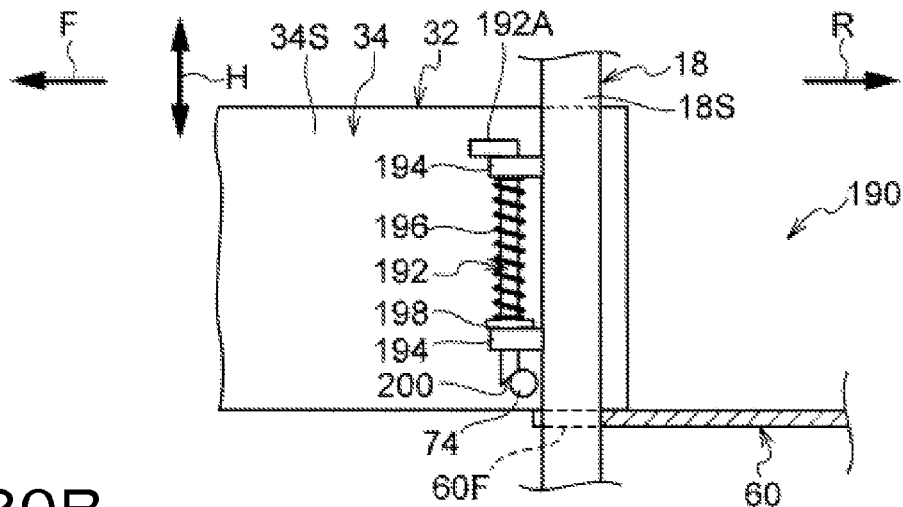
FIG. 20A is a side view illustrating a modified example of the lock mechanism illustrated in FIG. 4.

Next, a lock mechanism 190 illustrated in FIG. 20A includes a lock pin 192, a pair of brackets 194, and an elastic body 196. The lock pin 192 is an example of a lower engaged portion.

The lock pin 192 is attached to the front rack column 18 slidably in the height direction of the rack 12 through the pair of brackets 194. The elastic body 196 such as a coil spring is attached to the lock pin 192.

The elastic body 196 is arranged in a compressed state between an upper bracket 194 and a flange portion 198 provided to the lock pin 192. The lock pin 192 is urged downward at all times by the elastic body 196.

An operation portion 192A to be raised upward by an operator is provided to an upper end portion of the lock pin 192. On the other hand, an inclined surface 200 is formed at a lower end portion of the lock pin 192. The inclined surface 200 is located in front of the lower protrusion portion 74 with respect to the rack 12 in a state in which the electronic device 32 is housed in the rack 12. The inclined surface 200 is inclined so that as a point on the inclined surface 200 moves from a lower position to an upper position of the lock pin 192, the point moves toward the rear of the rack 12.

Figure 20B:
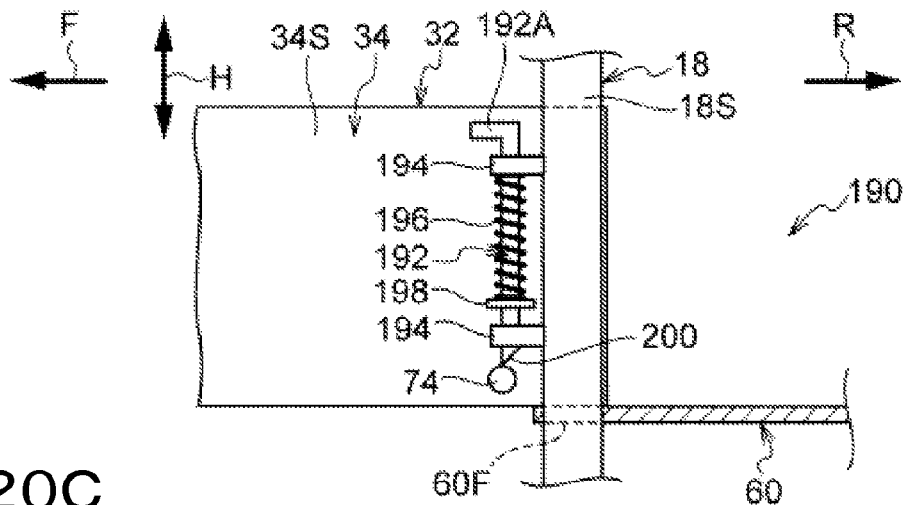
FIG. 20B is a side view illustrating a state in which an electronic device is being drawn out from the rack illustrated in FIG. 20A.
Figure 20C:
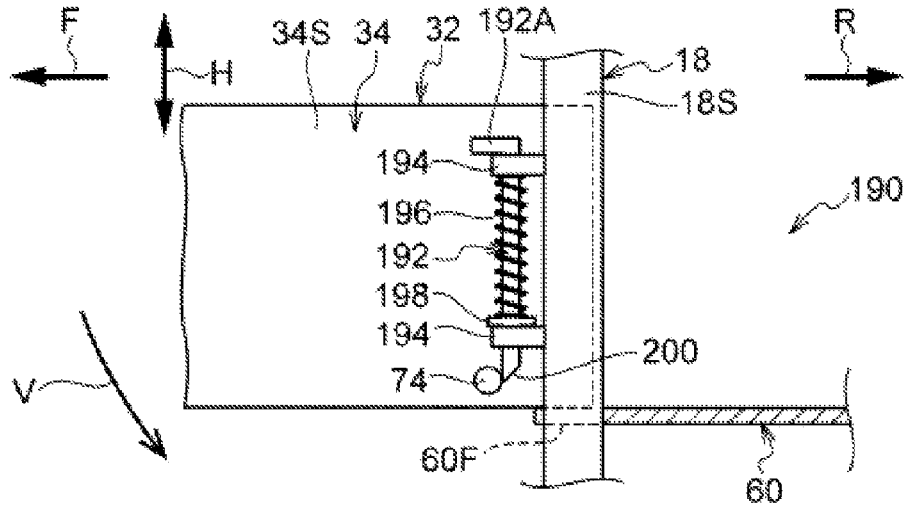
FIG. 20C is a side view illustrating a state in which the electronic device has been drawn out from the rack illustrated in FIG. 20B.

Here, as illustrated in FIG. 20B, the inclined surface 200 is pressed up by the lower protrusion portion 74 when the electronic device 32 is drawn out from the rack 12. As illustrated in FIG. 20C, in a state in which the electronic device 32 has been drawn out from the rack 12, the lock pin 192 rides over the lower protrusion portion 74 and the lock pin 192 is located in rear of the lower protrusion portion 74 with respect to the rack 12.

In this state, as illustrated by an arrow V, when the electronic device 32 is turned with the end portion 60F of the support rail 60 as a fulcrum, the lower protrusion portion 74 is engaged with a lower end portion of the lock pin 192 in the front-rear direction of the rack 12. Thereby, the turning of the electronic device 32 (in the direction indicated by the arrow V) is limited and the electronic device 32 is stopped from dropping off from the rack 12.

On the other hand, when the electronic device 32 is housed in the rack 12, an operator lifts the operation portion 192A and releases the engaged state between the lower protrusion portion 74 and the lock pin 192. Thereby, it is possible to house the electronic device 32 in the rack 12.

The pair of brackets 194 are detachably attached to the front rack column 18. Therefore, the pair of brackets 194 and the lock pin 192 may be shared by a plurality of electronic devices 32. Therefore, component costs of the pair of brackets 194 and the lock pin 192 are reduced.

Figure 21A:
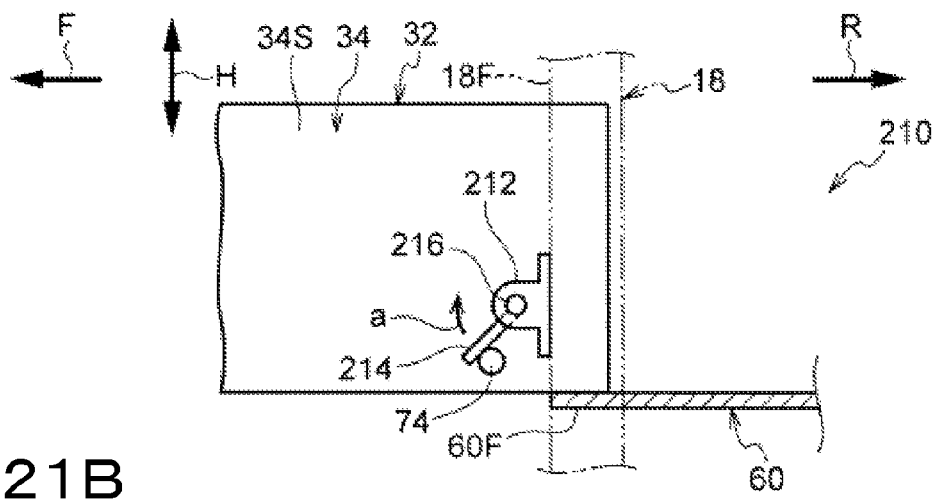
FIG. 21A is a side view illustrating a modified example of the lock mechanism illustrated in FIG. 4.

Next, a lock mechanism 210 illustrated in FIG. 21A includes a bracket 212 and a rotary lock plate 214. The rotary lock plate 214 is an example of a lower engaged portion.

The bracket 212 is fixed to the front wall portion 18F of the front rack column 18 with a screw or the like not illustrated in the drawings. The rotary lock plate 214 is attached to the bracket 212 through a turning shaft 216 extending in the width direction of the rack 12. The rotary lock plate 214 is stopped from turning to the rear of the rack 12 from an approximately vertical state illustrated in FIG. 21C by a stopper mechanism not illustrated in the drawings.

Figure 21B:
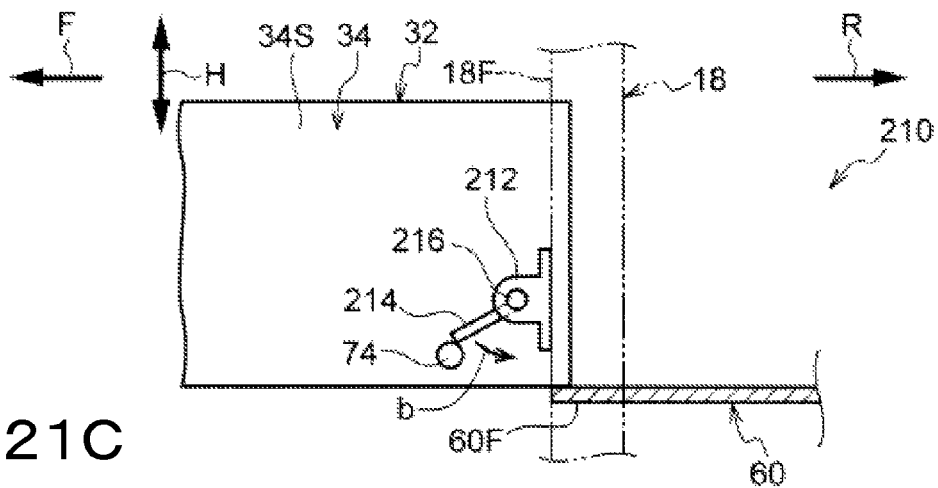
FIG. 21B is a side view illustrating a state in which a rotating plate illustrated in FIG. 21A has rotated.
Figure 21C:
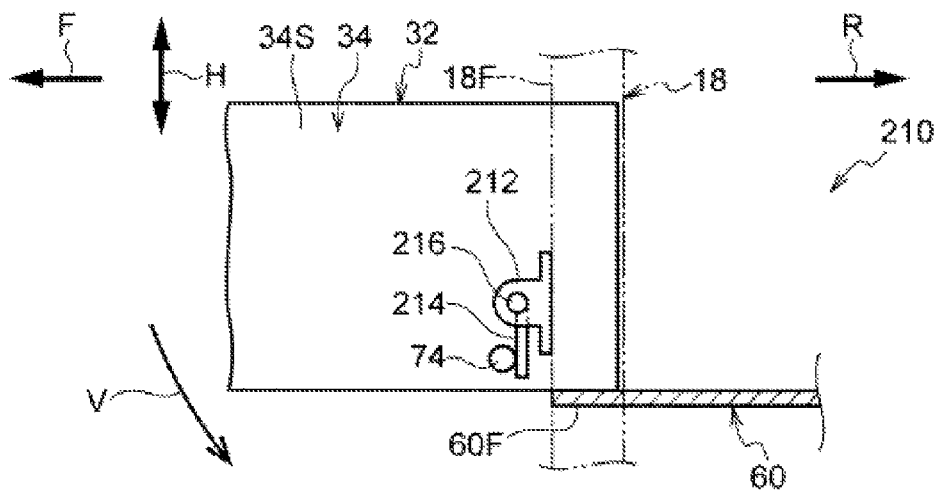
FIG. 21C is a side view illustrating a state in which a lower protrusion portion illustrated in FIG. 21B passes through the rotating plate.

The rotary lock plate 214 is located in front of the lower protrusion portion 74 with respect to the rack 12 in a state in which the electronic device 32 is housed in the rack 12. As the electronic device 32 is drawn out from the rack 12, the rotary lock plate 214 is pressed frontward of the rack 12 by the lower protrusion portion 74 as illustrated by an arrow a. As illustrated in FIG. 21B, when the lower protrusion portion 74 passes below the rotary lock plate 214 and the electronic device 32 has been drawn out from the rack 12, as illustrated by an arrow b, the rotary lock plate 214 is turned to the rear of the lower protrusion portion 74 with respect to the rack 12 by its own weight.

In this state, as illustrated by an arrow V, when the electronic device 32 is turned with the end portion 60F of the support rail 60 as a fulcrum, the lower protrusion portion 74 is engaged with the rotary lock plate 214 in the front-rear direction of the rack 12. Thereby, the turning of the electronic device 32 (in the direction indicated by the arrow V) is limited and the electronic device 32 is stopped from dropping off from the rack 12.

The bracket 212 is detachably attached to the front rack column 18. Therefore, the bracket 212 and the rotary lock plate 214 may be shared by a plurality of electronic devices 32. Therefore, component costs of the bracket 212 and the rotary lock plate 214 are reduced.

Next, a modified example of the upper engaging portion will be described.

Figure 22A:
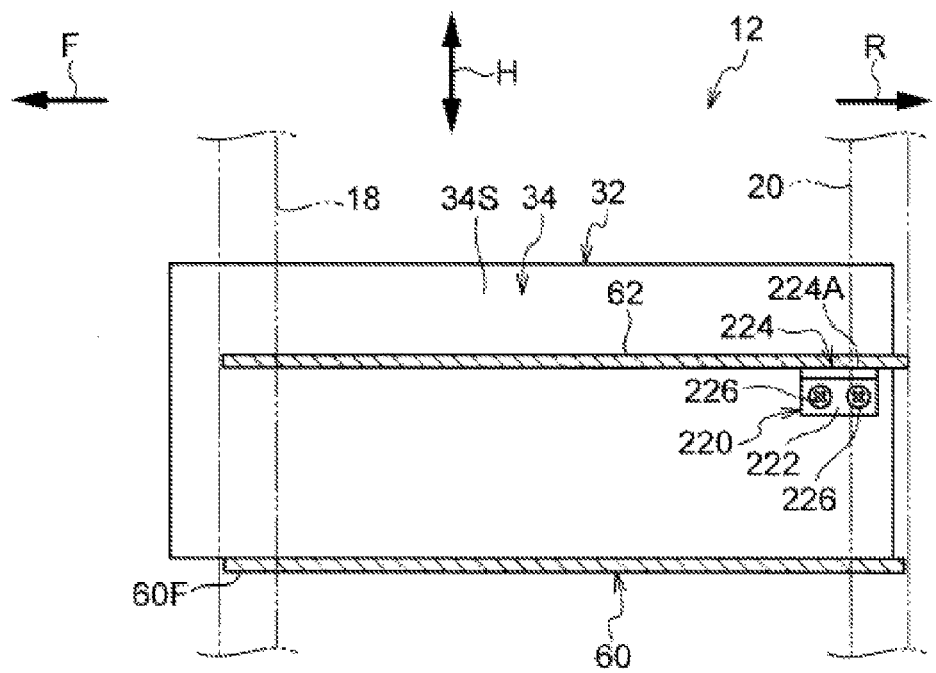
FIG. 22A is a side view illustrating a modified example of the lock mechanism illustrated in FIG. 4.

As illustrated in FIG. 22A, an upper engaging member 220 is formed to have an L-shaped cross section. The upper engaging member 220 has a flange portion 222 and a projecting portion 224. The projecting portion 224 is an example of an upper engaging portion.

The flange portion 222 is fixed to a rear portion of the side surface 34S of the electronic device 32 by screws 226. The projecting portion 224 projects from an upper end portion of the flange portion 222 to the outside in the width direction of the rack 12 and is arranged below the guide rail 62.

Here, the upper surface of the projecting portion 224 is an engaging surface 224A that is engaged with a lower surface of a rear end portion of the guide rail 62 in the height direction of the rack 12 in a state in which the electronic device 32 is housed in the rack 12. Thereby, for example, when an earthquake occurs or the rack 12 is transported, vibration of the electronic device 32 is suppressed.

Figure 22B:
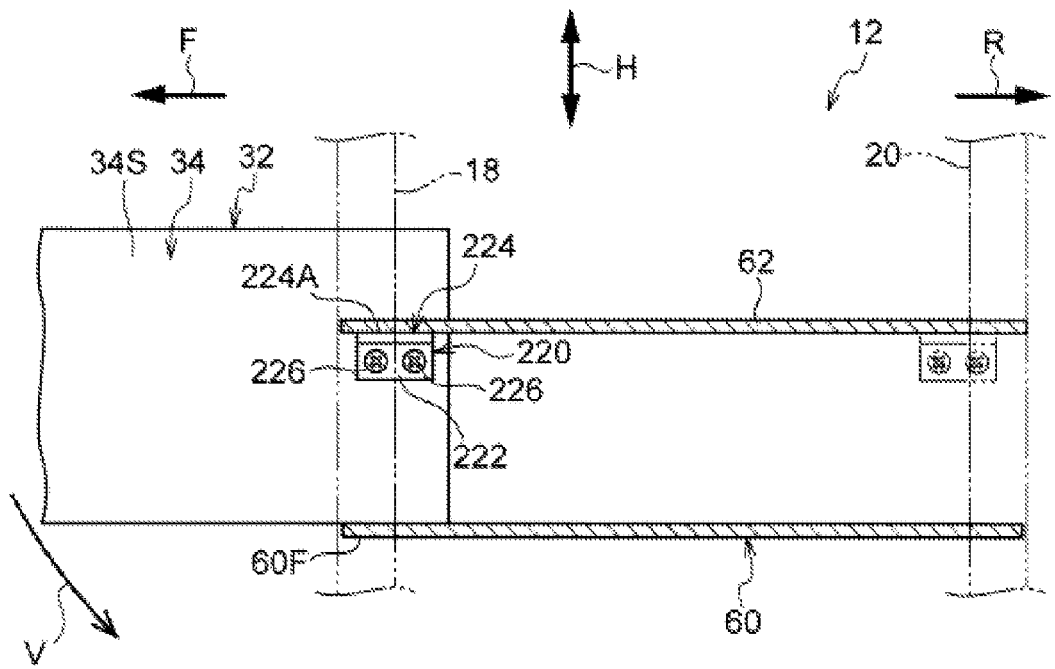
FIG. 22B is a side view illustrating a state in which an electronic device has been drawn out from the rack illustrated in FIG. 22A.

Further, as illustrated in FIG. 22B, in a state in which the electronic device 32 has been drawn out from the rack 12, the engaging surface 224A of the projecting portion 224 is engaged with a lower surface of a front end portion of the guide rail 62 in the height direction of the rack 12. Thereby, as illustrated by an arrow V, the turning of the electronic device 32 with the end portion 60F of the support rail 60 as a fulcrum is restricted. Therefore, the electronic device 32 is stopped from dropping off from the rack 12. Further, the engaging surface 224A of the projecting portion 224 is in surface-contact with the lower surface of the guide rail 62, so that the turning of the electronic device 32 is more reliably restricted.

The engaging surface 224A of the projecting portion 224 may be engaged with a member other than the guide rail 62. A member to be engaged with the engaging surface 224A of the projecting portion 224 may be separately provided to the front portion and the rear portion of the rack 12.

Next, a positional relationship between a lower protrusion portion 230 and an upper protrusion portion 232 which are provided to the side surface 34S of the electronic device 32 will be supplementary described with reference to FIGS. 23A and 23B.

Figure 23A:
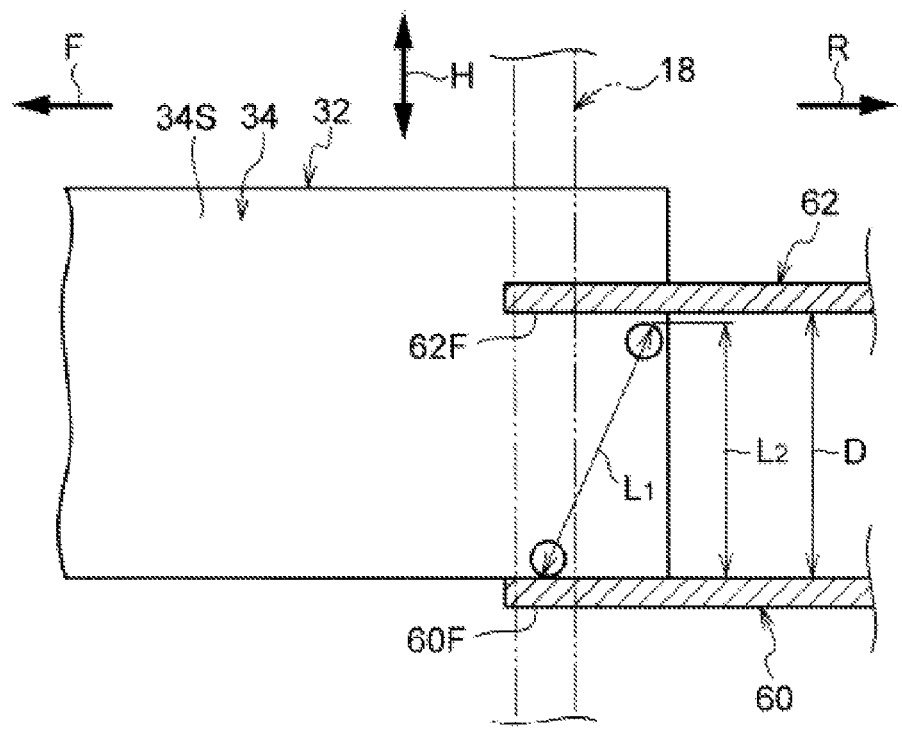
FIG. 23A is a side view illustrating a positional relationship between a lower protrusion portion and an upper protrusion portion.
Figure 23B:
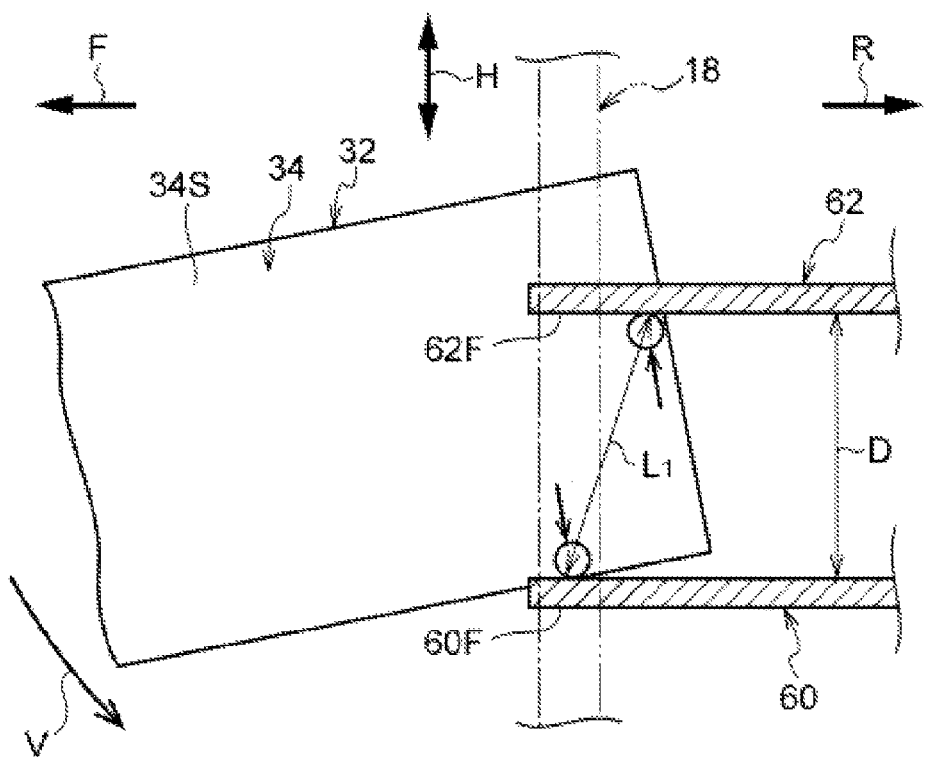
FIG. 23B is a side view illustrating a state in which the electronic device illustrated in FIG. 23A has rotated.

In FIGS. 23A and 23B, a distance between the support rail 60 and the guide rail 62 is represented by D. A distance between a contact portion 230A between the lower protrusion portion 230 and the support rail 60 and a contact portion 232A between the upper protrusion portion 232 and the guide rail 62 is represented by $L_1$. Further, a height between the contact portion 230A of the lower protrusion portion 230 and the contact portion 232A of the upper protrusion portion 232 is represented by $L_2$.

As illustrated in FIG. 23A, the lower protrusion portion 230 and the upper protrusion portion 232 are shifted from each other in the front-rear direction of the rack 12. Thereby, the distance $L_1$ between the contact portions 230A and 232A is greater than the distance D between the support rail 60 and the guide rail 62 ($D<L_1$). In this case, as illustrated by an arrow V in FIG. 23B, when the electronic device 32 is turned with the end portion 60F of the support rail 60 as a fulcrum, the contact portion 230A of the lower protrusion portion 230 and the contact portion 232A of the upper protrusion portion 232 are easily pressed and contacted to the support rail 60 and the guide rail 62, respectively. Thereby, the turning of the electronic device 32 is limited, so that the electronic device 32 is stopped from dropping off from the rack 12.

Further, the lower protrusion portion 230 and the upper protrusion portion 232 are shifted from each other in the front-rear direction of the rack 12, so that the height $L_2$ between the contact portion 230A and the contact portion 232A is shorter than the distance D between the support rail 60 and the guide rail 62 ($L_2<D$). Thereby, when an operator mounts the electronic device 32 in the rack 12, it is easy to insert the lower protrusion portion 230 and the upper protrusion portion 232 between the support rail 60 and the guide rail 62. Therefore, it is easy for the operator to mount the electronic device 32 in the rack 12.

In this manner, the upper protrusion portion 232 and the lower protrusion portion 230 are shifted from each other in the front-rear direction of the rack 12, so that the electronic device 32 is stopped from dropping off from the rack 12 and the electronic device 32 is easily mounted in the rack 12.

In the embodiment described above, the electronic device 32 is drawn out from the front of the rack 12. However, the electronic device 32 may be drawn out from the rear of the rack 12. In this case, the side to which the electronic device 32 is drawn out is the rear of the rack 12.

At least either one of the upper protrusion portion 72 and the lock mechanism 76 in the embodiment described above may be omitted.

While an embodiment of the technique disclosed by the present application has been described, the technique disclosed by the present application is not limited to the embodiment described above. The embodiment described above and the various modified examples may be appropriately combined and used, and of course, various aspects may be implemented without departing from the scope of the technique disclosed by the present application.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A rack mount device comprising:
   a support rail which is provided in a rack and which extends in a front-rear direction of the rack;
   an electronic device which is housed in the rack along the support rail and which is supported by the support rail;
   an upper support portion which is provided in the rack and which is arranged at a position higher than the support rail; and
   a holding member which extends obliquely downward from the upper support portion to a side to which the electronic device is drawn out and which holds the electronic device outside of the rack in a state in which the electronic device has been drawn out from the rack along the support rail.

2. The rack mount device according to claim 1,
   wherein the holding member holds the electronic device on the side to which the electronic device is drawn out and which is farther than a center of gravity of the electronic device.

3. The rack mount device according to claim 1,
   wherein the upper support portion is arranged at a position higher than the center of gravity of the electronic device, and
   wherein the holding member holds the electronic device at a position lower than the center of gravity of the electronic device.

4. The rack mount device according to claim 1, further comprising:
   an upper engaging portion which is provided at an upper portion of a side surface of the electronic device and which is located in rear of the center of gravity of the electronic device; and
   an upper engaged portion which is provided in the rack and which is located at a position higher than the upper engaging portion in a state in which the electronic device has been drawn out from the rack.

5. The rack mount device according to claim 4,
   wherein the upper engaging portion is an upper protrusion portion that protrudes from the side surface of the electronic device.

6. The rack mount device according to claim 1, further comprising:
   an lower engaging portion which is provided at a lower portion of a side surface of the electronic device and which is located in rear of a center of gravity of the electronic device; and
   a lower engaged portion which is provided in the rack and which is located at a position in rear of the lower engaging portion in a state in which the electronic device has been drawn out from the rack.

7. The rack mount device according to claim 6,
   wherein the lower engaging portion is a lower protrusion portion that protrudes from the side surface of the electronic device.

8. The rack mount device according to claim 6, further comprising:
   a lock rail which is provided in the rack and arranged on the support rail and which extends in the front-rear direction of the rack; and
   a rotary lock member whose one end is connected to the side surface of the electronic device through a turning shaft,
   wherein the lower engaging portion is a slide lock portion which is provided at the other end of the rotary lock member and which moves along the lock rail as the electronic device is drawn out, and
   wherein the lower engaged portion is a step portion which is provided on the lock rail and into which the slide lock portion is dropped when the electronic device is drawn out.

9. The rack mount device according to claim 1,
   wherein the holding member turns around a width direction of the rack as a turning center with respect to each of the upper support portion and the electronic device.

10. The rack mount device according to claim 1,
    wherein the support rail supports a rear portion of the electronic device in a state in which the electronic device has been drawn out from the rack.

11. The rack mount device according to claim 1, further comprising:
    a guide rail which is provided in the rack and arranged over the support rail and which extends in the front-rear direction of the rack,
    wherein the holding member is a turning arm whose lower end portion is connected to a side surface of the electronic device through a turning shaft,
    wherein a slide portion that moves along the guide rail as the electronic device is drawn out is provided in an upper end portion of the turning arm, and
    wherein the upper support portion is arranged on the side to which the electronic device is drawn out with respect to the slide portion and is engaged with the slide portion in a state in which the electronic device has been drawn out from the rack.

12. The rack mount device according to claim 11,
    wherein the upper support portion is arranged on the guide rail.

13. The rack mount device according to claim 1, further comprising:
    a held portion that protrudes from a side surface of the electronic device,
    wherein the holding member is a turning arm whose upper end portion is connected to the upper support portion through a turning shaft, and
    wherein a hook portion which is arranged on the side to which the electronic device is drawn out with respect to the held portion and which is hooked to the held portion when the electronic device is drawn out is provided in a lower end portion of the turning arm.

14. The rack mount device according to claim 13,
wherein the turning arm has an upper link member that is connected to the upper support portion and a lower link member that is connected to the upper link member through a turning shaft.

15. The rack mount device according to claim 1,
wherein the holding member is a wire member whose lower end portion is attached to a side surface of the electronic device and whose upper end portion is attached to the upper support portion.

16. The rack mount device according to claim 15,
wherein the upper end portion of the wire member is provided with an attaching hook portion that is hooked to the upper support portion.

17. The rack mount device according to claim 1,
wherein the rack includes two pairs of front rack column and rear lack column, the front rack column and the rear lack column facing each other in a front-rear direction of the rack, the pair of front rack column and rear lack column being provided on both sides in a width direction of the electronic device, and
wherein the support rail is bridged over the pair of front rack column and rear rack column, which is arranged on both sides in the width direction of the electronic device.

18. The rack mount device according to claim 1,
wherein the upper support portion is detachably attached to the front rack column, and
wherein the holding member is detachably attached to the upper support portion and the electronic device.

19. The rack mount device according to claim 1,
wherein the electronic device includes a chassis and a built-in unit that is stored into the chassis from an upper surface of the chassis.

* * * * *